US008581791B2

(12) United States Patent
Egawa et al.

(10) Patent No.: US 8,581,791 B2
(45) Date of Patent: Nov. 12, 2013

(54) COMMUNICATION DEVICE AND CONTROL METHOD

(75) Inventors: Hiroyuki Egawa, Fukuoka (JP); Masahiko Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 209 days.

(21) Appl. No.: 13/179,153

(22) Filed: Jul. 8, 2011

(65) Prior Publication Data

US 2012/0086611 A1 Apr. 12, 2012

(30) Foreign Application Priority Data

Oct. 7, 2010 (JP) ................................ 2010-227709

(51) Int. Cl.
*G01R 29/10* (2006.01)

(52) U.S. Cl.
USPC ........ 343/703; 455/134; 455/135; 455/277.1; 455/277.2

(58) Field of Classification Search
USPC ............. 343/703; 455/134, 135, 277.1, 277.2
See application file for complete search history.

(56) References Cited

U.S. PATENT DOCUMENTS

| | | | | |
|---|---|---|---|---|
| 6,064,868 | A * | 5/2000 | Kobayashi | 455/193.1 |
| 7,546,104 | B2 * | 6/2009 | Kitayama et al. | 455/277.2 |
| 7,953,141 | B2 * | 5/2011 | Hasegawa et al. | 375/148 |
| 2010/0323650 | A1 * | 12/2010 | Egawa et al. | 455/193.1 |

FOREIGN PATENT DOCUMENTS

| | | |
|---|---|---|
| JP | 2003-304112 A | 10/2003 |
| JP | 2007-124581 | 5/2007 |

* cited by examiner

*Primary Examiner* — Jerome Jackson, Jr.
*Assistant Examiner* — Hai Tran
(74) *Attorney, Agent, or Firm* — Fujitsu Patent Center

(57) ABSTRACT

A first adjustment circuit adjusts an impedance of a first antenna, and a second adjustment circuit adjusts an impedance of a second antenna. A coupling reduction circuit reduces an amount of coupling of the first and second antennas. A first reception power measurement unit measures first reception power received from the first antenna, and a second reception power measurement unit measures second reception power received from the second antenna. A selection unit selects a circuit from among the first adjustment circuit, the second adjustment circuit, and the coupling reduction circuit. A circuit control unit controls the impedance of the selected circuit so that the value of the evaluation function proportional to the product of the first reception power and the second reception power becomes larger.

7 Claims, 16 Drawing Sheets

| RELATIONSHIP BETWEEN INTERFERENCE POWER (Ib) IN MAIN ANTENNA AND THRESHOLD | CONTROL SIGNAL | ADJUSTMENT TARGET |
|---|---|---|
| $Ib < Th - L$ | 1 | MATCHING CIRCUIT a, MATCHING CIRCUIT b |
| $Th - L \leqq Ib < Th$ | 2 | MATCHING CIRCUIT a, MATCHING CIRCUIT b, COUPLING REDUCTION CIRCUIT |
| $Th \leqq Ib < Th + X$ | 3 | MATCHING CIRCUIT a, COUPLING REDUCTION CIRCUIT |
| $Th + X \leqq Ib$ | 4 | COUPLING REDUCTION CIRCUIT |

FIG. 5

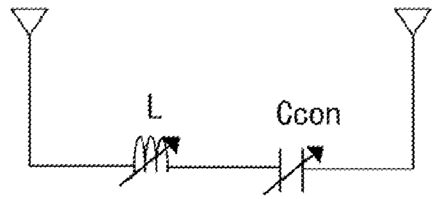
F I G. 7A
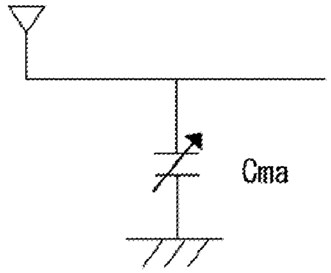
F I G. 7B
| No. | CAPACITANCE OF Cma | CAPACITANCE OF Ccon | INDUCTANCE VALUE OF L | EVALUATION FUNCTION |
|---|---|---|---|---|
| 1 | $C_1$ | $C_{11}$ | $L_1$ | $F_1$ |
| 2 | $C_2$ | $C_{11}$ | $L_1$ | $F_2$ |
| 3 | $C_3$ | $C_{11}$ | $L_1$ | $F_3$ |
| 4 | $C_1$ | $C_{12}$ | $L_1$ | $F_4$ |
| 5 | $C_2$ | $C_{12}$ | $L_1$ | $F_5$ |
| 6 | $C_3$ | $C_{12}$ | $L_1$ | $F_6$ |
| 7 | $C_1$ | $C_{13}$ | $L_1$ | $F_7$ |
| 8 | $C_2$ | $C_{13}$ | $L_1$ | $F_8$ |
| 9 | $C_3$ | $C_{13}$ | $L_1$ | $F_9$ |
| ... | ... | ... | ... | ... |
F I G. 7C

| | CONTROL SIGNAL | NUMBER OF CONDITIONS | | |
|---|---|---|---|---|
| | | MATCHING CIRCUIT a | MATCHING CIRCUIT b | COUPLING REDUCTION CIRCUIT |
| 1 | 1 | 3 | 4 | 1 |
| 2 | 2 | 2 | 3 | 2 |
| 3 | 3 | 3 | 1 | 4 |
| 4 | 4 | 1 | 1 | 12 |
| ... | ... | ... | ... | ... |

FIG. 8

| F [GHz] | ΔC [pF] WHEN ΔX=79.5 Ω |
|---|---|
| 1.0 | 2.0 |
| 1.1 | 1.81 |
| 1.2 | 1.66 |
| 1.3 | 1.53 |
| 1.4 | 1.42 |

⋮

| F [GHz] | ΔL [nH] WHEN ΔX=79.5 Ω |
|---|---|
| 1.0 | 12.6 |
| 1.1 | 11.5 |
| 1.2 | 10.5 |
| 1.3 | 9.7 |
| 1.4 | 9.0 |
| ⋮ | ⋮ |

| | CONTROL SIGNAL | NUMBER OF CONDITIONS | | |
|---|---|---|---|---|
| | | MATCHING CIRCUIT a | MATCHING CIRCUIT b | COUPLING REDUCTION CIRCUIT |
| 1 | 1 | 3 | 4 | 1 |
| 2 | 2 | 2 | 3 | 2 |
| 3 | 3 | 1 | 4 | 3 |
| 4 | 4 | 4 | 1 | 2 |
| 5 | 5 | 1 | 1 | 12 |

FIG. 16

COMMUNICATION DEVICE AND CONTROL METHOD

CROSS-REFERENCE TO RELATED APPLICATIONS

This application is based upon and claims the benefit of priority of the prior Japanese Patent Application No. 2010-227709, filed on Oct. 7, 2010, the entire contents of which are incorporated herein by reference.

FIELD

The present invention relates to a communication device and a method of adjusting an antenna provided for the communication device.

BACKGROUND

In a long term evolution (LTE) in which services are to be provided, a multiple input multiple output (MIMO) system is used to improve the utilization efficiency of frequencies. A terminal used in the MIMO system is provided with a plurality of antennas, and can perform communications by simultaneously using a plurality of channels between the terminal and a base station. However, when the terminal is provided with a plurality of antennas, there occurs the problem that the coupling among the antennas degrades the transmission characteristic. For example, in the terminal provided with antennas A and B, the transmission characteristic can be degraded because a signal which is transmitted from the antenna A is absorbed by the other antenna B. To solve the problem, there is a device proposed to arrange a variable coupler between the antennas A and B, and perform control so that the amount of coupling of the variable coupler between the antennas A and B can increase during reception, and decrease during transmission.

DOCUMENT OF PRIOR ART

Patent Document

[Patent Document 1] Japanese Laid-open Patent Publication No. 2007-124581

Although the amount of coupling among a plurality of antennas is successfully controlled, there is still a problem that the transmission characteristic is not improved if the impedance of each antenna is not adjusted into an appropriate value. Recently, since an antenna is loaded in a terminal in many cases, the impedance of the antenna easily fluctuates depending on the use state of the terminal. When the performance of the antenna is preferable, its throughput is also high. Therefore, it is preferable to efficiently improve the performance of the antenna. Although the case of the LTE is described above, it is also preferable to efficiently improve the performance of each antenna when a communication device provided with a plurality of antennas is used.

SUMMARY

A communication device according to an embodiment includes a first antenna, a second antenna, a first adjustment circuit, a second adjustment circuit, a coupling reduction circuit, a first reception power measurement unit, a second reception power measurement unit, a selection unit, and a circuit control unit. The first adjustment circuit adjusts the impedance of the first antenna. The second adjustment circuit adjusts the impedance of the second antenna. The coupling reduction circuit reduces the amount of coupling of the first antenna and the second antenna. The first reception power measurement unit measures the first reception power received from the first antenna. The second reception power measurement unit measures the second reception power received from the second antenna. The selection unit selects any circuit from among the first adjustment circuit, the second adjustment circuit, or the coupling reduction circuit. The circuit control unit controls the impedance of the selected circuit so that the value of the evaluation function proportional to the product of the first reception power and the second reception power becomes larger.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is an example of a circuit selection table.

FIGS. 7A through 7C are explanatory views of an example of adjusting the matching circuit and the coupling reduction circuit.

FIG. 8 is an example of a condition number table.

FIG. 16 is an example of the condition number table used in the communication device.

DESCRIPTION OF EMBODIMENTS

Figure 1:
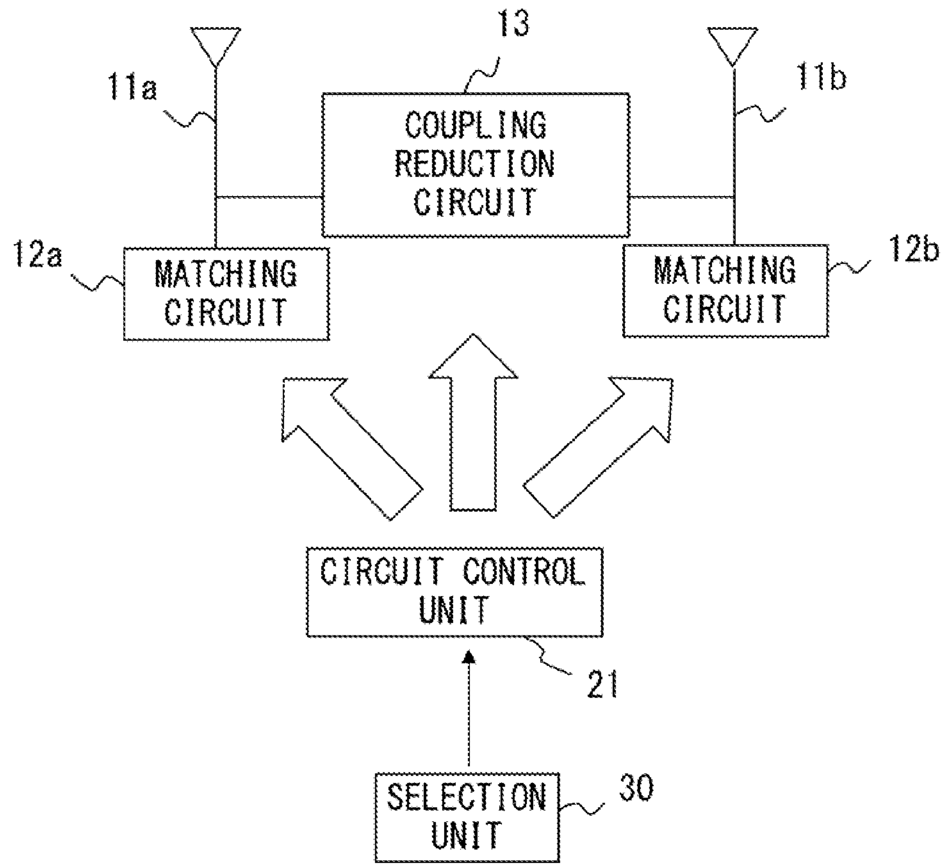
FIG. 1 is an explanatory view of an example of the operation of the communication device.

FIG. 1 is an explanatory view of an example of the operation of the communication device 10. A communication device 10 illustrated in FIG. 1 includes antennas 11 (11*a*, 11*b*), matching circuits 12 (12*a*, 12*b*), a coupling reduction circuit 13, a circuit control unit 21, and a selection unit 30. For comprehensibility, FIG. 1 illustrates a part of the circuit etc. provided for the communication device 10.

With the configuration, it is assumed that the matching circuit 12*a* adjusts the impedance of the antenna 11*a*, and the matching circuit 12*b* adjusts the impedance of the antenna 11*b*. The communication device 10 can change the amount of coupling of the antennas 11*a* and 11*b* by adjusting the reactance of the coupling reduction circuit 13. In the following description, the amount of loss caused between one antenna and another antenna is hereinafter referred to as an "amount of coupling".

The selection unit 30 selects a circuit for adjusting the impedance for larger reception power at each of the antennas 11*a* and 11*b* from among the matching circuits 12*a* and 12*b* and the coupling reduction circuit 13. The selection unit 30 notifies a circuit control unit 21 of the selected circuit. The circuit control unit 21 adjusts the impedance of the notified circuit. For example, when the matching circuit 12*a* and the coupling reduction circuit 13 are selected, the circuit control unit 21 changes the capacitance of a capacitor and the inductance value of an inductor included in each circuit. The circuit control unit 21 calculates the value of an evaluation function based on the measurement result of the reception power each time the capacitance of the capacitor and the inductance value of the inductor changes. It is assumed that the evaluation function is proportional to the product of the reception power of the antennas 11*a* and 11*b*. The circuit control unit 21 associates the value of the obtained evaluation function with the capacitance of the capacitor and/or the inductance value of the inductor of each circuit and stores the value. Furthermore, the circuit control unit 21 obtains and stores the evaluation function before changing the capacitance of the capacitor and the inductance value of the inductor. Then, the circuit control unit 21 compares the stored value of the evaluation function, and adjusts the circuit selected by the selection unit 30 with reference to the capacitance of the capacitor and the inductance value of the inductor for which the value of the evaluation function is the largest.

Thus, the circuit to be adjusted is selected depending on the reception power from among the matching circuits 12*a* and 12*b* and the coupling reduction circuit 13, and the selected circuit is adjusted, thereby successfully increasing the reception power of the antennas 11*a* and 11*b*. Therefore, the communication device 10 adjusts the matching circuits 12*a* and 12*b* in addition to the coupling reduction circuit 13 depending on the level of the reception power in the antennas 11*a* and 11*b*, thereby easily improving the function of the antenna.

<Configuration of Device>

Figure 2:
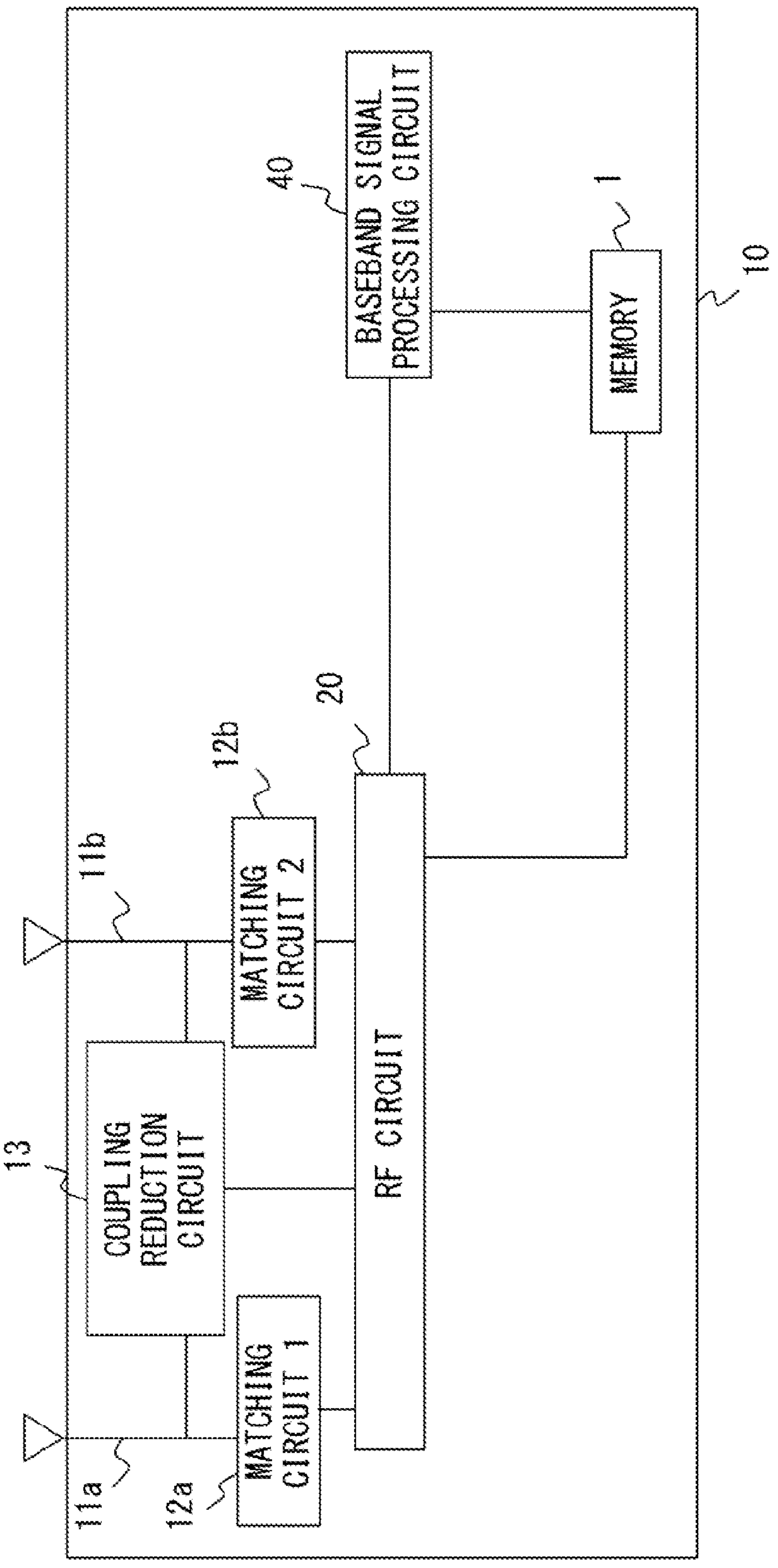
FIG. 2 is an example of the configuration of the communication device according to the first embodiment.

FIG. 2 is an example of the configuration of the communication device 10 according to the first embodiment. The communication device 10 includes the antennas 11*a* and 11*b*, the matching circuits 12*a* and 12*b*, the coupling reduction circuit 13, a radio frequency (RF) circuit 20, a baseband (BB) signal processing circuit 40, and memory 1. The RF circuit 20 includes the circuit control unit 21, and adjusts the circuit selected by the selection unit 30. The RF circuit 20 modulates and demodulates a signal transmitted and received between the communication device 10 and a base station. The baseband signal processing circuit 40 includes the selection unit 30. The baseband signal processing circuit 40 selects a circuit to be adjusted and processes a baseband signal and measures the interference power etc. The memory 1 stores a threshold, data, etc. used in the processes performed by the RF circuit 20 and the baseband signal processing circuit 40. Described below in detail is the communication device 10 when the coupled power is measured as an amount of coupling. In the description below, "coupled power" means an electric power observed through a first antenna when the signal output from a second antenna of the equipment including the first and second antennas is received by the first antenna. The amount of coupling is not limited to the coupled power. For example, when a signal transmitted from the antenna A is absorbed by another antenna B, the intensity of the signal observed by the antenna B may also be referred to as the "amount of coupling".

Figure 3:
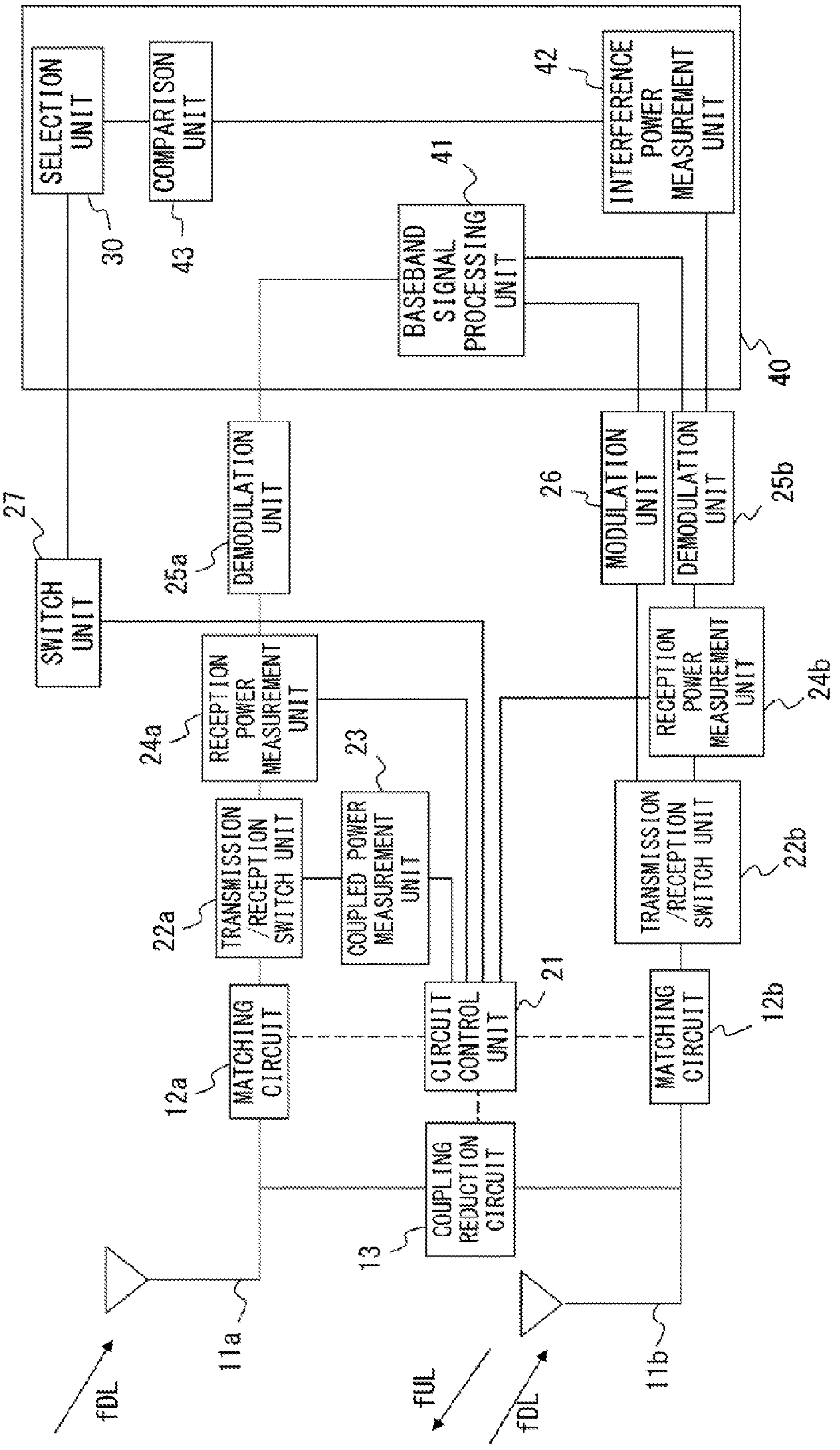
FIG. 3 is an explanatory view of an example of the configuration of the communication device.

FIG. 3 is an explanatory view of an example of the configuration of the communication device 10. FIG. 3 illustrates in detail the configurations of the RF circuit 20 and the baseband signal processing circuit 40. The RF circuit operates as the circuit control unit 21, a transmission/reception switch unit 22 (22*a*, 22*b*), a coupled power measurement unit 23, a reception power measurement unit 24 (24*a*, 24*b*), a demodulation unit 25 (25*a*, 25*b*), a modulation unit 26, and a switch unit 27. The baseband signal processing circuit 40 operates as a baseband signal processing unit 41, an interference power measurement unit 42, a comparison unit 43, and a selection unit 30. In addition, in the example illustrated in FIG. 3, the communication device 10 receives a signal from a base station through both of the antennas 11*a* and 11*b*, and transmits a signal to the base station through the antenna 11*b*.

The circuit control unit 21 changes the capacitance of a capacitor and the inductance value of an inductor included in the circuit selected by the selection unit 30. Furthermore, the circuit control unit 21 obtains an evaluation function based on the reception power etc. at the antennas 11*a* and 11*b* after changing the capacitance of the capacitor and the inductance value of the inductor. The circuit control unit 21 controls the selected circuit so that the value of the evaluation function becomes larger. That is, the circuit control unit 21 acquires the condition under which the largest value of the obtained evaluation function values is acquired, and adjusts the circuit to be adjusted according to the acquired condition. The operation of the circuit control unit 21 is described later in detail.

The transmission/reception switch unit 22*a* connects the antenna 11*a* to the reception power measurement unit 24*a* when the communication device 10 receives a signal. Therefore, when the communication device 10 receives a signal, the signal received through the antenna 11*a* is input to the demodulation unit 25*a* through the reception power measurement unit 24*a*. When the communication device 10 transmits a signal to a base station, the transmission/reception switch unit 22*a* connects the antenna 11*a* to the coupled power measurement unit 23. In the example illustrated in FIG. 3, when a signal is transmitted from the communication device 10 to a base station, the signal is not transmitted from the antenna 11*a*. Therefore, when a signal is transmitted from the communication device 10, the coupled power measurement unit 23 measures the power from the antenna 11*b* absorbed by the antenna 11*a*. The coupled power measurement unit 23 notifies the circuit control unit 21 of the measured coupled power.

When the communication device 10 receives a signal, the transmission/reception switch unit 22*b* connects the antenna 11*b* to the reception power measurement unit 24*b*. Therefore, the signal received through the antenna 11*b* is input to the demodulation unit 25*b* through the reception power measurement unit 24*b*. On the other hand, when the communication device 10 transmits a signal to a base station, the transmission/reception switch unit 22*b* connects the antenna 11*b* to the modulation unit 26, thereby outputting the signal modulated by the modulation unit 26 to the antenna 11*b*.

The demodulation units 25*a* and 25*b* modulates the input signal, and converts it into a baseband signal. The baseband signal is input to the baseband signal processing unit 41. The baseband signal processing unit 41 processes the baseband signal. The baseband signal processing unit 41 also processes the signal transmitted to a base station, and then outputs it to the modulation unit 26. The modulation unit 26 modulates the signal input from the baseband signal processing unit 41, and outputs the modulated signal to the antenna 11*b* through the transmission/reception switch unit 22*b*.

The reception power measurement unit 24*a* measures the power of the signal received through the antenna 11*a*. On the other hand, the reception power measurement unit 24*b* measures the power of the signal received through the antenna 11*b*. The reception power measurement units 24*a* and 24*b* notify the circuit control unit 21 of the obtained reception power.

The interference power measurement unit 42 measures the interference power (external interference power) received by the communication device 10 from the base station other than the communicating base station through the antenna 11*b*. The comparison unit 43 stores one or more thresholds in advance, and compares interference power level with the threshold. The comparison unit 43 notifies the selection unit 30 of an obtained result.

The selection unit 30 selects a circuit to be adjusted based on the comparison result. An example of a method of selecting the circuit to be adjusted is described later in detail. The selection unit 30 notifies the switch unit 27 of the selected circuit. For example, the selection unit 30 transmits a control signal to the switch unit 27, thereby notifying the unit of the selected circuit. The switch unit 27 confirms the control signal notified from the selection unit 30, and performs switching among the circuit control unit 21, the matching circuits 12*a* and 12*b*, and the coupling reduction circuit 13. For example, when the matching circuit 12*a* and the coupling reduction circuit 13 are selected as circuits to be adjusted, the switch unit 27 switches the circuits so that the circuit control unit 21 can access the matching circuit 12*a* and the coupling reduction circuit 13. Furthermore, the switch unit 27 notifies the circuit control unit 21 of the circuit selected by the selection unit 30.

First Embodiment

Described below is an example of the operation performed according to the first embodiment. The communication device 10 selects a circuit to be adjusted from among the matching circuits 12 and the coupling reduction circuit 13 in a predetermined period, and adjusts the selected circuit. For example, the communication device 10 may adjust the matching circuits 12 and the coupling reduction circuit 13 each time a pilot signal is transmitted to a base station. When the adjustment of a circuit is started, the communication device determines a circuit to be adjusted depending on the comparison result between the level of the external interference power and a reference threshold (Th).

Figure 4A:
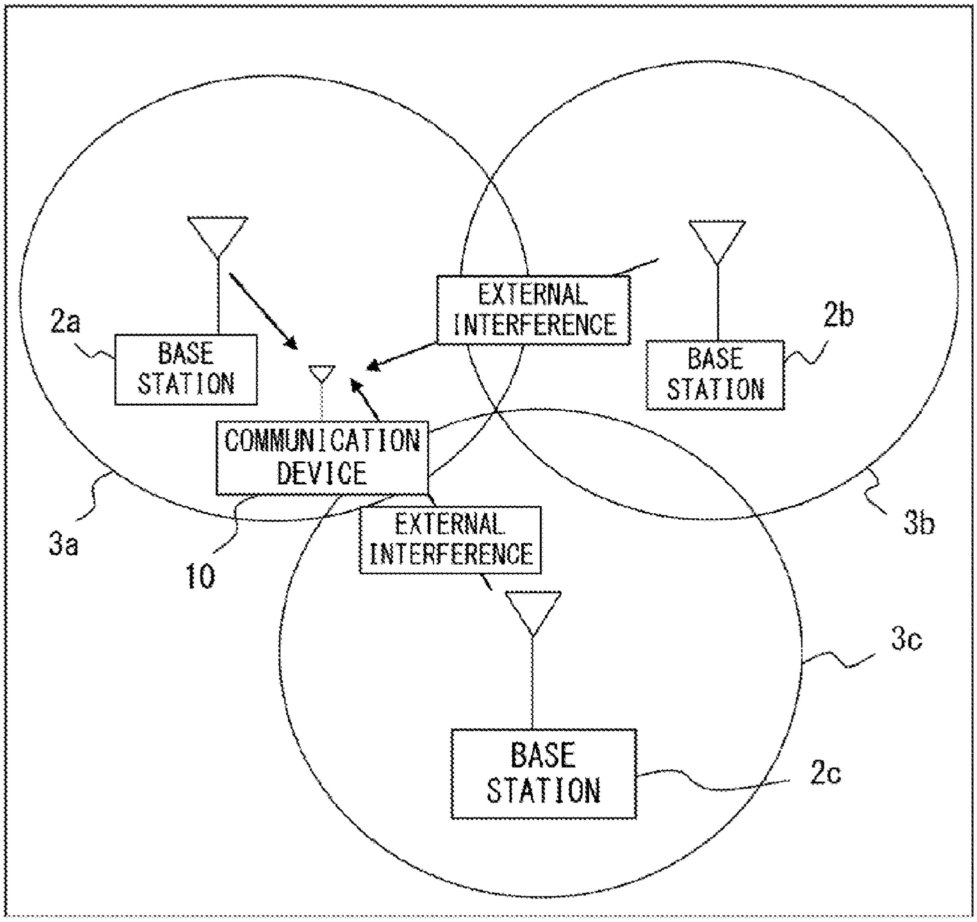
FIGS. 4A and 4B are explanatory views of an example of interference power received by an antenna.
Figure 4B:
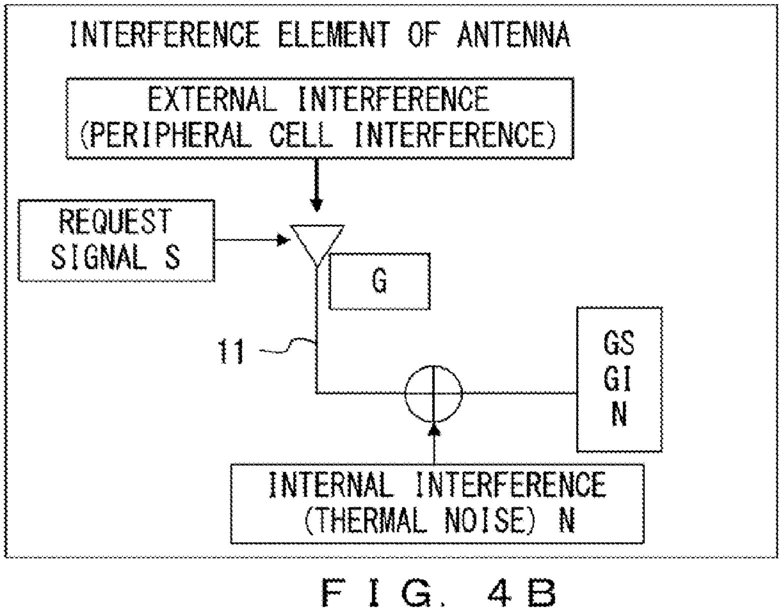

FIGS. 4A and 4B are explanatory views of an example of the interference power received by an antenna 11. As illustrated in FIG. 4A, assume that the communication device 10 communicates with a base station 2*a*. It is also assumed that the base station 2*a* forms a cell 3*a*. Cells 3*b* and 3*c* are adjacent to the cell 3*a*. Assume that the cell 3*b* is formed by a base station 2*b*, and the cell 3*c* is formed by a base station 2*c*.

It is also assume that a signal received from the base station 2*a* is a request signal (S) for the communication device 10. On the other hand, the signal received by the communication device 10 from the base stations 2*b* and 2*c* is an interference signal. As illustrated in FIG. 4A, when the communication device 10 does not receive a signal from a base station other than the base stations 2*a* through 2*c*, the intensity of the external interference (I) is a total of the signals received by the communication device 10 from the base stations 2*b* and 2*c*.

Furthermore, when the antenna 11 is used, internal interference (N) by thermal noise occurs. Therefore, an interference signal generated when the antenna 11 receives a request signal is expressed by the external interference and the internal interference as illustrated in FIG. 4B. Then, the signal to interference ratio (SIR) is expressed by the following equation using the antenna gain G.

$$SIR = \frac{GS}{GI + N} \tag{1}$$

where it is assumed that one of the thresholds stored in the comparison unit 43 is a reference threshold Th. It is also assumed that the product of the reference threshold Th and the antenna gain is sufficiently larger than N (ThG>>N). Therefore, when the level of the power of the external interference received by the antenna 11 is equal to or exceeds the reference threshold (that is, I≥Th), GI is sufficiently larger than the internal interference of the antenna 11. That is, GI>>N. Then, the signal to interference ratio is expressed as follows.

$$SIR \approx \frac{GS}{GI} = \frac{S}{I} \tag{2}$$

Therefore, when the power intensity of the external interference is equal to or exceeds the reference threshold, the antenna gain does not affect the signal to interference ratio. Accordingly, although the matching circuit 12 is adjusted to change the antenna gain, the signal to interference ratio is hardly improved. On the other hand, when the power of the external interference is smaller than the reference threshold, the external interference of the antenna 11 is not sufficiently larger than the internal interference. Therefore, since the signal to interference ratio is expressed as indicated by the equation (1) above, the increased antenna gain G improves the signal to interference ratio. That is, when the power intensity of the external interference is smaller than the reference threshold, the performance of the antenna is improved by changing the impedance of the matching circuit 12 to increase the antenna gain, thereby also improving the reception state of the communication device 10. On the other hand, when the power intensity of the external interference is equal to or exceeds the reference threshold, the performance of the antenna is hardly improved if the antenna gain G is changed by changing the impedance of the matching circuit 12, thereby also not improving the reception state of the communication device 10. Therefore, when the power intensity of the external interference is equal to or exceeds the reference threshold, the communication device 10 may more largely improve the performance of the antenna by adjusting the coupling reduction circuit 13 than by adjusting the matching circuit 12.

As described above with reference to FIGS. 4A and 4B, the result of comparing the interference power with the reference threshold is used as an index of determining whether or not the SIR or the reception power can be improved by adjusting the matching circuit 12. Based on the interference power of the antenna having a larger antenna gain in the two antennas 11 provided for the communication device 10, the selection unit 30 selects the circuit to be adjusted. For example, assume that the antenna gain (Gb) of the antenna 11*b* is larger than the antenna gain (Ga) of the antenna 11_a_ in the communication device 10 illustrated in FIG. 3. Then, the interference power measurement unit 42 provided for the communication device 10 measures the interference power (Ib) received through the antenna 11_b_. The interference power measurement unit 42 notifies the comparison unit 43 of the value of the interference power Ib.

The comparison unit 43 compares the interference power notified from the interference power measurement unit 42 with the threshold. In this example, the comparison unit 43 stores two thresholds Th−L and Th, and calculates the thresholds Th+X. The number of thresholds stored or the number of thresholds calculated by the comparison unit 43 can be arbitrarily changed. In the following description, it is assumed that Th is sufficiently larger than the internal interference Nb of the antenna 11_b_. In addition, X is a difference in antenna gain between the antenna 11_a_ and the antenna 11_b_.

$$X=|Ga-Gb| \quad (3)$$

In addition, L can be any positive value, and appropriate varied depending on the implementation. For example, L can be about 5 dB based on Th. The comparison unit 43 outputs the comparison result between the interference power and the threshold to the selection unit 30.

FIG. 5 is an example of a circuit selection table. The circuit selection table stores the relationship in level between the interference power and the threshold associated with the type of the circuit to be adjusted. The selection unit 30 is provided with the table illustrated in FIG. 5, and selects the circuit to be adjusted depending on the result received from the comparison unit 43.

For example, when the power value (Ib) of the external interference received through the antenna 11_b_ is smaller than Th−L, the signal to interference ratio can be improved if the antenna gain Gb is increased by the adjustment of the impedance of the matching circuit 12_b_ as explained above with reference to FIGS. 4A and 4B. Although with the antenna 11_a_ having a smaller antenna gain than the antenna 11_b_, it is predicted that the product of the external interference power (Ia) and the antenna gain (Ga) is not sufficiently larger than that with the internal interference (Na) of the antenna 11_a_. If the value of Ia×Ga is not sufficiently larger than the internal interference of the antenna 11_a_, the signal to interference ratio of the antenna 11_a_ can be improved by increasing the antenna gain (Ga) by the adjustment of the impedance of the matching circuit 12_a_. Then, when Ib is smaller than Th−L, the selection unit 30 determines to adjust the matching circuits 12_a_ and 12_b_.

Also when the external interference power Ib is equal to or exceeds Th−L but is smaller than Th, the reception state of the communication device 10 is improved by the adjustment of the matching circuits 12_a_ and 12_b_. As described above with reference to FIGS. 4A and 4B, the lower the external interference power, the more easily the signal to interference ratio can be improved by the improvement of the antenna gain. Therefore, although the impedance of the antenna 11_b_ is adjusted, it is considered that the improvement of the reception state of the communication device 10 is lower than when Ib is smaller than Th−L. Accordingly, the selection unit 30 determines to also adjust the coupling reduction circuit 13 in addition to the matching circuits 12_a_ and 12_b_.

When the external interference power Ib is equal to or exceeds Th but is smaller than Th+X, the equation (2) is valid because the external interference power of the antenna 11_b_ is larger than the reference threshold. Accordingly, although the circuit control unit 21 changes the antenna gain Gb of the antenna 11_b_, the signal to interference ratio of the antenna 11_b_ is not improved. That is, although the impedance of the matching circuit 12_b_ is adjusted, the reception state of the communication device 10 is hardly changed. Then, the selection unit 30 does not select the matching circuit 12_b_ as a circuit to be adjusted. On the other hand, there is the possibility that the equation (1) is valid for the antenna 11_a_ because the antenna gain of the antenna 11_a_ is smaller than that of the antenna 11_b_ by X (dB). Then, the selection unit 30 determines to adjust the matching circuit 12_a_ and the coupling reduction circuit 13_a_.

When the external interference power Ib is equal to or exceeds Th+X, the equation (2) is valid for the antenna 11_b_ because the external interference power larger than the reference threshold. Also with the antenna 11_a_, as with the antenna 11_b_, it is expected that the external interference power is large and the equation (2) is also valid for the antenna 11_a_. Therefore, there is a strong possibility that the signal to interference ratio is not improved by changing the antenna gain Gb of the antenna 11_b_ and the antenna gain Ga of the antenna 11_a_. That is, although the impedance of the matching circuits 12_a_ and 12_b_ is changed, there is a strong possibility that the reception state of the communication device 10 is hardly changed. Then, the selection unit 30 determines to adjust the coupling reduction circuit 13 without adjusting the matching circuits 12_a_ and 12_b_.

Figure 6:
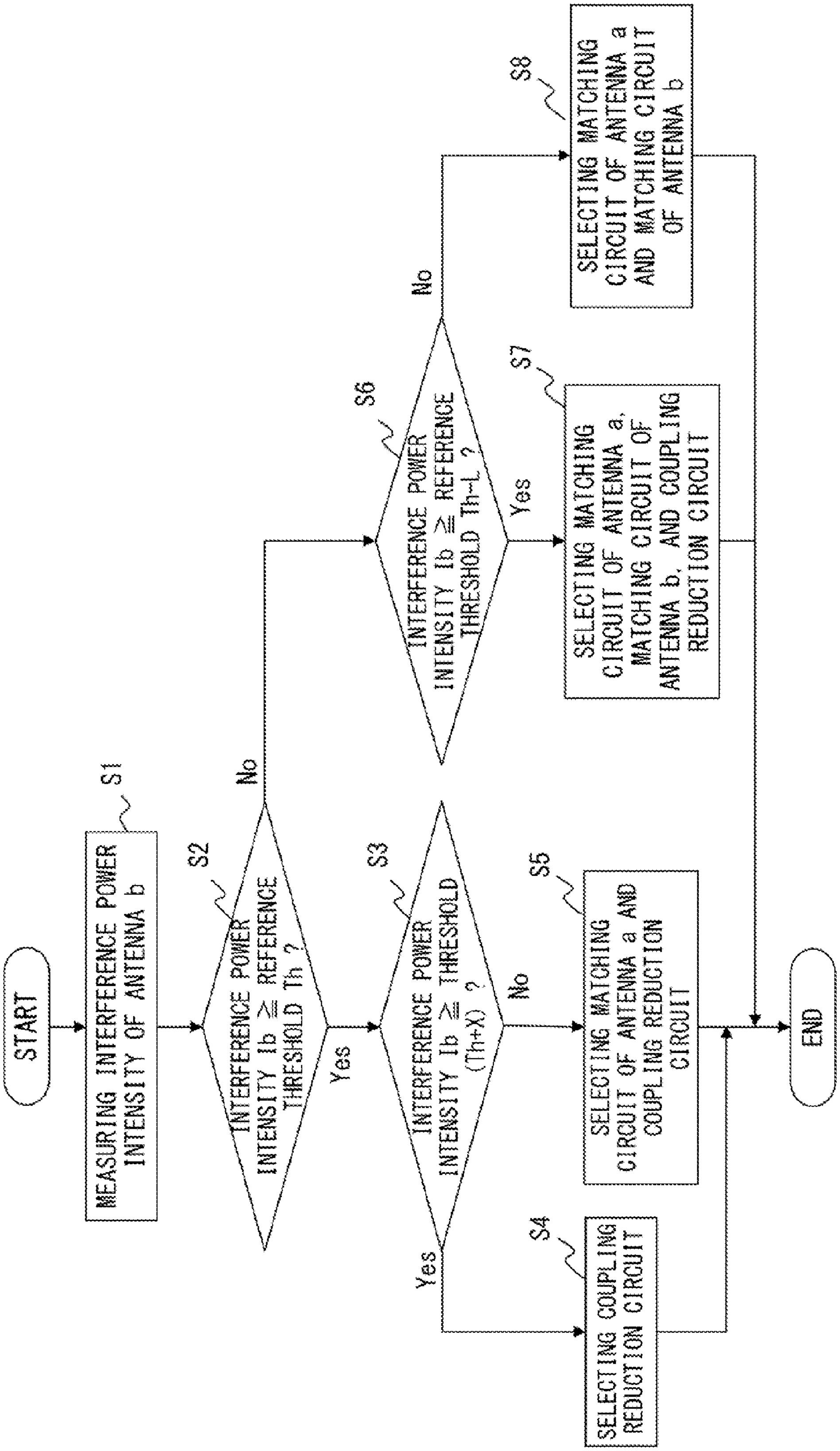
FIG. 6 is a flowchart for explanation of an example of method for selection of a circuit to be adjusted.

FIG. 6 is a flowchart of explaining an example of a method of selecting a circuit to be adjusted. FIG. 6 is an example of the operation of the communication device 10, and the operation of the communication device 10 can be changed by, for example, changing the determining order in steps S2, S3, and S6.

The interference power measurement unit 42 measures the intensity of the interference power of the antenna 11_b_ (step S1). The comparison unit 43 confirms whether or not the intensity of the interference power Ib received through the antenna 11_b_ is equal to or exceeds the reference threshold Th (step S2). When the value of the interference power is equal to or exceeds the reference threshold in step S2, the comparison unit 43 obtains the absolute value X of the difference between the antenna gain of the antenna 11_a_ and the antenna gain of the antenna 11_b_. The comparison unit 43 further compares the interference power Ib with the threshold Th+X (YES in step S2, step S3). When the interference power Ib is equal to or exceeds the threshold Th+X, the selection unit 30 selects the coupling reduction circuit 13 as an adjustment target, and does not select the matching circuits 12_a_ and 12_b_ as adjustment targets (YES in step S3, step S4). When the interference power Ib is smaller than the threshold Th+X, the selection unit 30 selects the matching circuit 12_a_ connected to the antenna 11_a_ and the coupling reduction circuit 13 as adjustment targets, and does not select the matching circuit 12_b_ as an adjustment target (NO in step S3, step S5).

In step S2, if it is determined that the value of the interference power is smaller than the reference threshold, the comparison unit 43 further compares the interference power Ib with the threshold Th−L (NO in step S2, step S6). When the interference power Ib is equal to or exceeds the threshold Th−L, the selection unit 30 selects the matching circuits 12_a_ and 12_b_ and the coupling reduction circuit 13 as adjustment targets (YES in step S6, step S7). When the interference power Ib is smaller than the threshold Th−L, the selection unit 30 selects the matching circuits 12_a_ and 12_b_ as adjustment targets, and does not select the coupling reduction circuit 13 as an adjustment target (YES in step S6, step S8).

Thus, when the value of the interference power Ib is equal to or exceeds the reference threshold, the selection unit 30 does not select the matching circuit 12_b_ connected to the antenna 11$b$ as an adjustment target. On the other hand, when the value of the interference power Ib is smaller than the reference threshold, the selection unit 30 selects the matching circuit 12$b$ as an adjustment target.

When the selection unit 30 selects a circuit to be adjusted, the selection unit 30 outputs a selection result to the switch unit 27. In the example of the circuit selection table illustrated in FIG. 5, a control signal for identification of the circuit to be adjusted is associated with a combination of circuits to be adjusted and recorded. For example, when the matching circuits 12$a$ and 12$b$ are controlled, the control signal "1" is reported to the switch unit 27. Then, the switch unit 27 performs switching so that the circuit control unit 21 can access the matching circuits 12$a$ and 12$b$, and then notifies the circuit control unit 21 of the control signal. Similarly, the control signal used when the matching circuits 12$a$ and 12$b$ and the coupling reduction circuit 13 are controlled is "2", and the control signal used when only the coupling reduction circuit 13 is controlled is "4".

Described below is an example when the matching circuit 12$a$ and the coupling reduction circuit 13 are selected. In this case, the selection unit 30 notifies the switch unit 27 of the control signal "3". The switch unit 27 performs switching so that the circuit control unit 21 can access the matching circuit 12$a$ and the coupling reduction circuit 13. Furthermore, the switch unit 27 notifies the circuit control unit 21 of the control signal.

FIGS. 7A through 7C are explanatory views of examples of adjusting the matching circuit 12 and the coupling reduction circuit 13. FIG. 7A illustrates a variable inductor and a variable capacitor included in the coupling reduction circuit 13. In the following description, the variable inductor included in the coupling reduction circuit 13 is expressed as L, and the variable capacitor included in the coupling reduction circuit 13 is expressed as Ccon. FIG. 7B illustrates a variable capacitor included in the matching circuit 12. Hereafter, the variable capacitor included in the matching circuit 12$a$ is expressed as Cma, and the variable capacitor included in the matching circuit 12$b$ is expressed as Cmb.

The circuit control unit 21 adjusts the impedance of the matching circuit 12$a$ and the reactance of the coupling reduction circuit 13 according to the notification from the switch unit 27. First, the circuit control unit 21 changes the capacitance of the variable capacitor and/or the inductance value of the variable inductor included in the matching circuit 12$a$ and the coupling reduction circuit 13. Next, the circuit control unit 21 obtains an evaluation function each time the capacitance of the variable capacitor and/or the inductance value of the variable inductor are changed. Furthermore, the circuit control unit 21 compares the obtained evaluation functions to obtain the capacitance of the variable capacitor and the inductance value of the variable inductor when the evaluation function is a maximum value. Using the obtained inductance value and the capacitance of the capacitor, the matching circuit 12$a$ and the coupling reduction circuit 13 are adjusted. In this process, the amount of change of the capacitance of the capacitor and the amount of change of the inductance value can be arbitrarily set depending on the implementation. For example, the circuit control unit 21 can be set so that the value of the variable capacitor can be changed by 1 pF and the inductance value of the variable inductor can be changed by 5 nH.

Described next is an evaluation function. The circuit control unit 21 stores an evaluation function in advance so that the better status the antenna has, the larger value the function is assigned. Described in this example is the case in which an evaluation function is obtained from the determinant of the correlation matrix obtained from the reception characteristic of the antennas 11$a$ and 11$b$. Described first is an example of obtaining an evaluation function. The transmission capacitance R of the communication device 10 is expressed as follows.

$$R = \frac{1}{2}\log\left(\left|E + P\frac{HH^{+}}{N}\right|\right) \tag{4}$$

where P indicates the reception power of the communication device 10, E indicates a unit matrix, N indicates internal interference power, and H indicates a channel matrix. The ensemble average of the transmission capacitance R can be expressed by the following equation.

$$\langle \text{average of } R\rangle = \left\langle\frac{1}{2}\log\left(\left|E + P\frac{HH^{+}}{N}\right|\right)\right\rangle \approx \frac{1}{2}\log\left(\left|E + \frac{P}{N}\langle HH^{+}\rangle\right|\right) \tag{5}$$

where $<HH^{+}>$ indicates a correlation matrix, and can be described as follows.

$$\text{correlation matrix} = \frac{1}{2}\begin{bmatrix} \langle x_a(t)x_a^*(t)\rangle & \langle x_a(t)x_b^*(t)\rangle \\ \langle x_b(t)x_a^*(t)\rangle & \langle x_b(t)x_b^*(t)\rangle \end{bmatrix} = \frac{1}{2}\begin{bmatrix} Pa & \alpha\sqrt{PaPb} \\ \alpha^*\sqrt{PaPb} & Pb \end{bmatrix} \tag{6}$$

where $x_a(t)$ and $x_b(t)$ indicate complex received signals. Furthermore, Pa indicates a measured value of the reception power measurement unit 24$a$, Pb indicates a measured value of the reception power measurement unit 24$b$, $\alpha$ indicates the correlation (reception correlation) between the signal received by the antenna 11$a$ and the signal received by the antenna 11$b$. Therefore, the determinant of the correlation matrix is expressed as follows.

$$\tfrac{1}{2}\{PaPb(1-|\alpha|^2)\} \tag{7}$$

By the calculation using a scattering parameter, the correlation $\alpha$ can be written into the following equation.

$$|\alpha|^2 = W\frac{Qa}{Qt} \tag{8}$$

where Qa indicates a measured value of the coupled power measurement unit 23, Qt indicates the transmission power of the signal transmitted by the communication device 10 from the antenna 11$b$, and W indicates a weighting factor. It is assumed that the circuit control unit 21 receives a value of Qt from the modulation unit 26 in advance. Then, the evaluation function f is expressed by the following equation.

$$f = PaPb\left(1 - W\frac{Qa}{Qt}\right) \tag{9}$$

The weighting factor is used to adjust the level of the contribution of the reception power of the antennas 11$a$ and 11$b$ to the evaluation function, and the level of the contribution of the intensity of the coupled power to the evaluation function. The weighting factor W depends of the state of the reception, but can be set as 0.35, for example.

For example, the capacitance of Cma, the capacitance of Ccon, the inductance value of L when the adjustment of the circuit is started are as follows.

Capacitance of Cma when the adjustment of the circuit is started: $C_1$

Capacitance of Ccon when the adjustment of the circuit is started: $C_{11}$

Inductance value of L when the adjustment of the circuit is started: $L_1$

The circuit control unit 21 calculates the evaluation function for each case when the capacitance of Cma is $C_1$, $C_2$, $C_3$, the capacitance of Ccon is $C_{11}$, $C_{12}$, $C_{13}$, the inductance value of the variable inductor L of the coupling reduction circuit 13 is $L_1$, $L_2$, $L_3$, $L_4$, $L_5$. Assume that, for the variable capacitor, the minimum value of the amount of change of the capacitance is $\Delta C$, and for the variable inductor, the minimum value of the amount of change of the inductance value is $\Delta L$. Then, the circuit control unit 21 varies the capacitance of the capacitor included in the circuit selected by the selection unit 30 by the value of the integral multiple of $\Delta C$. The circuit control unit 21 also varies the inductance value of the inductor by the value of the integral multiple of $\Delta L$. For example, $C_2$, $C_3$, $C_{12}$, $C_{13}$, $L_2$, $L_3$, $L_4$, $L_5$ can be expressed using the $C_1$, $C_{11}$, $L_1$ as follows.

$$C_2=C_1+\Delta C$$

$$C_3=C_1-\Delta C$$

$$C_{12}=C_{11}+\Delta C$$

$$C_{13}=C_{11}-\Delta C$$

$$L_2=L_1+\Delta L$$

$$L_3=L_1-\Delta L$$

$$L_4=L_1+2\Delta L$$

$$L_5=L_1-2\Delta L$$

FIG. 7C is an example of a table storing the value of an obtained evaluation function associated with the capacitance of Ccon and Cma and the inductance value of L. FIG. 7C illustrates the values up to the value of the evaluation function when the inductance value L is $L_1$. The circuit control unit 21 compares the values of obtained evaluation functions. Assume that the value of $F_5$ is the largest in the values of the obtained evaluation functions. Then, the circuit control unit 21 determines $C_2$ as the adjusted value of Cma, $C_{12}$ as the adjusted value of Ccon, and $L_1$ as the adjusted value of L, thereby adjusting the capacitance of Ccon and Cma and the inductance value of L.

Thus, a circuit selected from among the coupling reduction circuit 13 and the matching circuits 12*a* and 12*b* is adjusted in the communication device 10. In addition to the coupling reduction circuit 13, the matching circuits 12*a* and 12*b* can be adjusted. Therefore, the communication device 10 can more easily improve the performance than when only the coupling reduction circuit 13 is regarded as an adjustment target. When the antenna 11 is loaded in the terminal, the impedance of the antenna 11 can be largely changed depending on how the user holds the terminal. In addition, in a folding terminal, the impedance of the antenna 11 can be changed when the terminal folds and when it is set up. Therefore, the matching circuit 12 of the antenna 11 is determined as an adjustment target, thereby easily improving the performance of the antenna 11.

Furthermore, the communication device 10 uses the power intensity of the external interference as an index of determining the level of the improvement of the performance of the antenna 11 by the adjustment of the matching circuit 12. Therefore, when the transmission characteristic can be hardly improved by changing the antenna gain, the adjustment of the matching circuit 12 can be avoided. Therefore, the communication device 10 according to the present embodiment can efficiently improve the performance of the antenna 11. In addition, by the improvement of the performance of the antenna 11, the reception state of the communication device 10 can also be improved.

Second Embodiment

In the first embodiment, since the upper limit of the computational effort of the circuit control unit 21 is not determined, the computational effort of the circuit control unit 21 becomes high, and can prolong the processing time. Therefore, in the second embodiment, the communication device for adjusting a circuit within a predetermined processing time is described. The circuit control unit 21 provided for the communication device 10 according to the second embodiment includes a condition number table 31 (FIG. 8). The condition number table 31 can be stored in the memory 1.

In the communication device 10 according to the second embodiment, the total number of conditions under which the circuit control unit 21 can obtain an evaluation function within a determined processing time is obtained. The condition number table 31 is determined so that the number of evaluation functions obtained by the circuit control unit 21 can be equal to or smaller than the obtained total number. For example, the case in which the communication device 10 may calculate 12 variations of evaluation functions within the determined processing time is described. It is assumed that the circuit control unit 21 changes the impedance of reactance of the selected circuit, calculates the evaluation function after the change, compares the obtained evaluation functions, and adjusts the circuit selected by the selection unit 30 within the determined processing time.

FIG. 8 is an example of the condition number table 31. In the condition number table 31, the number of conditions compared in one adjusting operation on each of the matching circuits 12*a* and 12*b* and the coupling reduction circuit 13 is determined.

In the condition associated with the control signal 1 in FIG. 8, since the number of conditions of the coupling reduction circuit 13 is one, the circuit control unit 21 does not change the capacitance of a capacitor or the inductance value of an inductor included in the coupling reduction circuit 13. On the other hand, since the number of conditions associated with the matching circuit 12*a* is three, the circuit control unit 21 can set the capacitance of the capacitor Ca included in the matching circuit 12*a* in three variations, that is, $C_1$, $C_2$, and $C_3$. Similarly, since the number of conditions associated with the matching circuit 12*b* is four, the circuit control unit 21 can set the capacitance of the capacitor Cb included in the matching circuit 12*b* in four variations, that is, $C_4$, $C_5$, $C_6$, and $C_7$. When Ca is set as $C_1$, Cb can be a value as one of the four variations, and when Ca is set as $C_2$ or $C_3$, Cb can be a value as one of four variations. Therefore, the circuit control unit 21 adjusts the circuit under the condition of $3\times4=12$ variations. The circuit control unit 21 obtains an evaluation function under each condition, and compares the evaluation functions. The method of calculating an evaluation function, the method of changing the capacitance of a capacitor, and the method of changing the inductance value are similar to those according to the first embodiment. In addition, the circuit control unit 21 adjusts the capacitance of a capacitor and the inductance value of an inductor into the value used in the condition of the largest value of the obtained evaluation function.

When the control signal is 2, the number of conditions of the matching circuit 12*a* is 2, the number of conditions of the matching circuit 12*b* is 3, and the number of conditions of the coupling reduction circuit 13 is 2. Therefore, the circuit control unit 21 adjusts the selected circuit into 2×3×2=12 variations of conditions, and the value of the evaluation function in each case is obtained. Similarly, when the control signal is 3, the number of conditions of the matching circuit 12*a* is 3, the number of conditions of the matching circuit 12*b* is 1, and the number of conditions of the coupling reduction circuit 13 is 4. Therefore, the evaluation functions of 12 variations of conditions are compared. Similarly when the control signal is 4, the coupling reduction circuit 13 is set under 12 variations of conditions, and an evaluation function is obtained in each condition.

Figure 9:
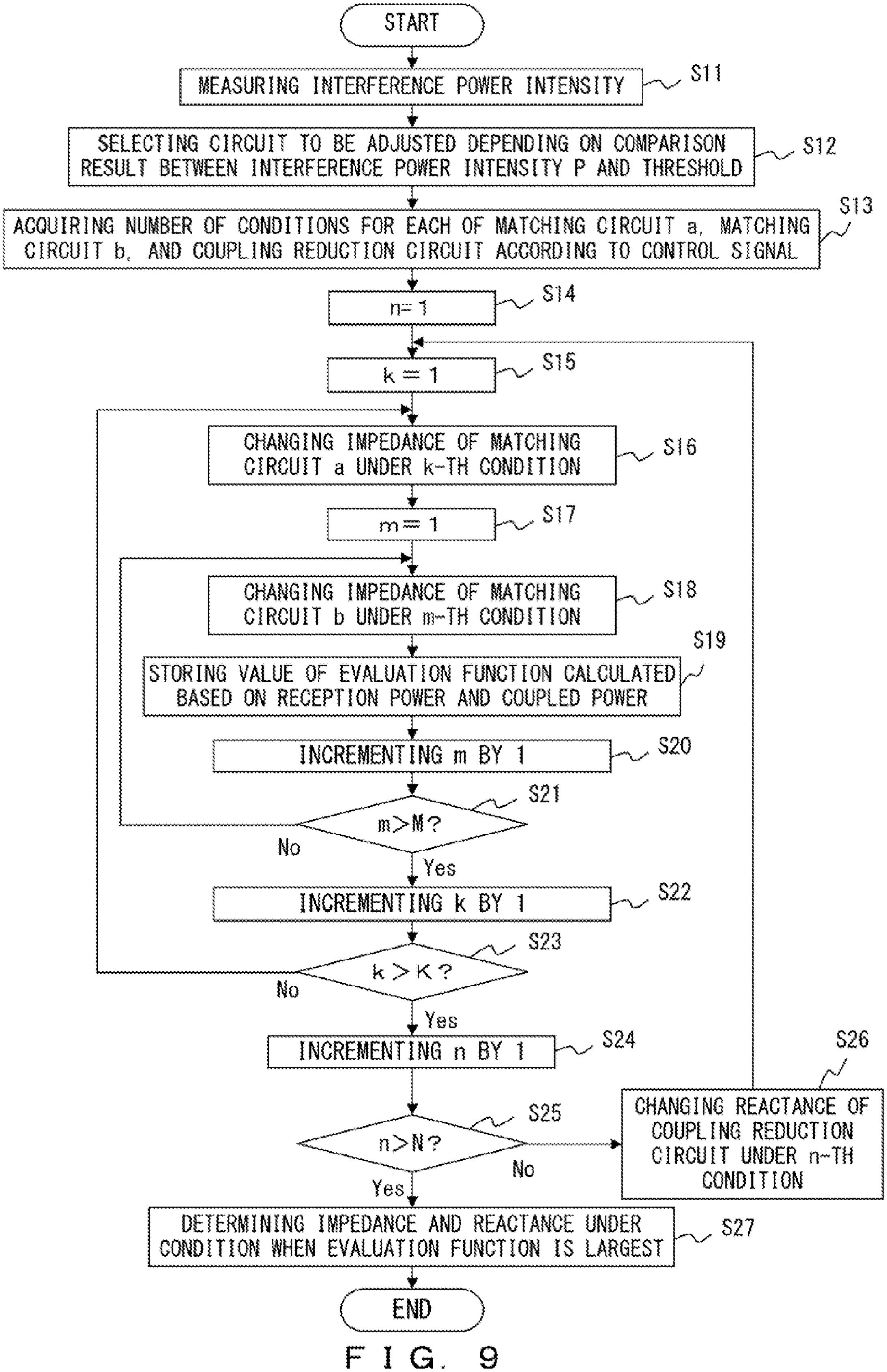
FIG. 9 is a flowchart for explanation of an example of the operation of the communication device according to the second embodiment.

FIG. 9 is a flowchart for explanation of an example of the operation of the communication device 10 according to the second embodiment. In FIG. 9, K, M, and N are constants, and respectively indicate the number of conditions of the matching circuit 12*a*, the number of conditions of the matching circuit 12*b*, and the number of conditions of the coupling reduction circuit 13. K, M, and N are integers equal to or exceed 1. The character k is a variable for count of the condition of the matching circuit 12*a* used in calculating an evaluation function, and the character m is a variable for count of the condition of the matching circuit 12*b* used in calculating an evaluation function. The number of conditions of the coupling reduction circuit 13 used in calculating an evaluation function is counted using the variable n. In the flowchart in FIG. 9, the circuit control unit 21 changes the conditions in the order of the matching circuits 12*a* and 12*b* and the coupling reduction circuit 13, but the order in which the conditions of the circuit to be adjusted can be arbitrarily changed.

The interference power measurement unit 42 obtains the intensity of the interference power received through the antenna 11*b* (step S11). The selection unit 30 selects a circuit to be adjusted depending on the comparison result between the value of the interference power and the threshold (step S12). The operation of the step 12 is similar to that in the case of the first embodiment described above with reference to FIG. 6. When the circuit control unit 21 receives the control signal for designation of the circuit selected by the selection unit 30, the circuit control unit 21 refers to the condition number table 31, and acquires the number of conditions of each of the matching circuits 12*a* and 12*b* and the coupling reduction circuit 13 (step S13).

The circuit control unit 21 sets the variable n to 1, and the variable k also to 1 (steps S14 and S15). The circuit control unit 21 changes the capacitance of the capacitor included in the matching circuit 12*a* according to the k-th condition, and changes the impedance of the matching circuit 12*a* (step S16). The circuit control unit 21 sets the variable m to 1 (step S17). The circuit control unit 21 changes the capacitance of the capacitor included in the matching circuit 12*b* according to the m-th condition, and changes the impedance of the matching circuit 12*b* (step S18). Next, the circuit control unit 21 obtains an evaluation function using the measurement result obtained from each of the coupled power measurement unit 23, the reception power measurement unit 24*a*, and the reception power measurement unit 24*b*, and stores an obtained value in the memory 1 (step S19). The circuit control unit 21 then increments the variable m by 1, and determines whether or not the variable m is larger than the constant M (steps S20 and S21). The circuit control unit 21 repeats the processes in steps S18 through S21 until the variable m exceeds M. On the other hand, when m is larger than M, the circuit control unit 21 increments the variable k by 1, and determines whether or not the variable k is larger than the constant K (YES in step S21, steps S22 and S23). The circuit control unit 21 repeats the processes in steps S16 through S23 until the variable k exceeds K. If it is determined in step S23 that the variable k is larger than K, the circuit control unit 21 increments the variable n by 1, and then determines whether or not n is larger than N (steps S24 and S25). When the variable n is equal to or smaller than N, the circuit control unit 21 changes the reactance of the coupling reduction circuit 13 according to the n-th condition (step S26). The circuit control unit 21 can change one or more of the capacitance value of the variable capacitor and the inductance value of the variable inductor. Then, the circuit control unit 21 repeats the processes in steps S15 through S26. On the other hand, if n is larger than N, the circuit control unit 21 refers to the memory 1, and compares the obtained evaluation function. The circuit control unit 21 adjusts the capacitor and the inductor included in the matching circuits 12*a* and 12*b* and the coupling reduction circuit 13 into the value used in the condition in which the evaluation function value is the largest (step S27).

Thus, by using the condition number table 31 in which the number of combinations of conditions is constant, the circuit control unit 21 can obtain the impedance or the reactance set in the selected circuit with constant computational effort regardless of the number of selected circuits and the number of types of selected circuits. Therefore, the communication device 10 can control the circuit selected within a predetermined processing time. When the antenna 11 is built in a terminal, the impedance can fluctuate depending on how the user holds the terminal etc. Therefore, it is desirable to adjust the circuit in real time depending on the fluctuation of the performance of the antenna 11. In the communication device 10 according to the present embodiment, the number of conditions used in one adjusting operation is set in the condition number table 31, thereby suppressing the adjusting time within a predetermined time. Therefore, the communication device 10 can adjust the circuit in real time depending on the fluctuation of the transmission characteristic.

Third Embodiment

Figure 10:
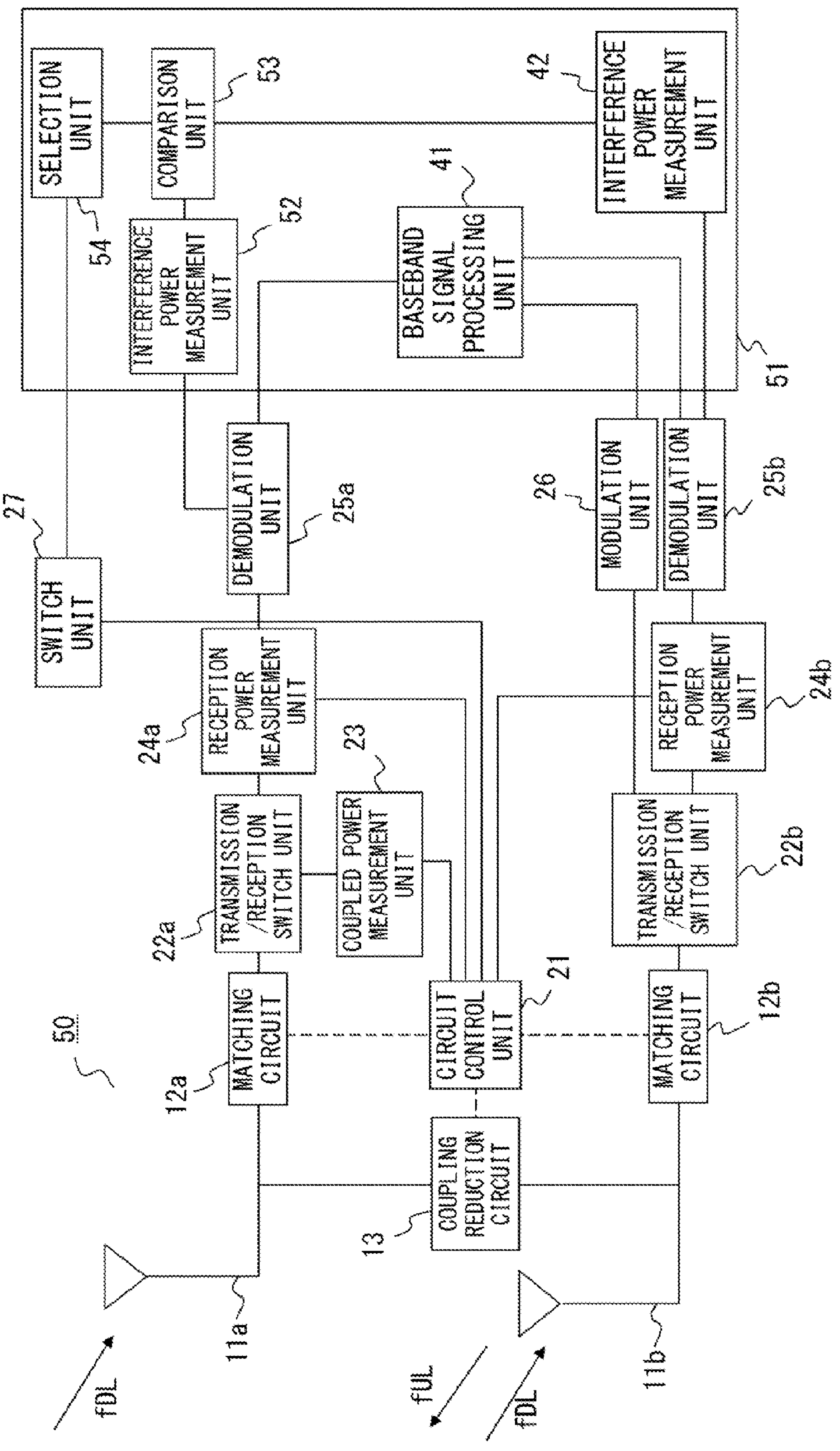
FIG. 10 is an example of the configuration of the communication device according to the third embodiment.

FIG. 10 is an explanatory view of an example of the configuration of the communication device 50 according to the third embodiment. FIG. 10 expresses in detail the configuration of the RF circuit 20 and a baseband signal processing circuit 51. The configuration and the operation of the RF circuit 20 of the communication device 50 are similar to those according to the embodiments 1 and 2. The baseband signal processing circuit 51 operates as the baseband signal processing unit 41, the interference power measurement unit 42, an interference power measurement unit 52, a comparison unit 53, and a selection unit 54. The operations of the baseband signal processing unit 41 and the interference power measurement unit 42 are similar to those according to the embodiments 1 and 2.

The interference power measurement unit 52 measures the interference power (Ia) received from the base station other than the base station with which the communication device 50 communicates. The comparison unit 53 compares the intensity of the interference power reported from the interference power measurement unit 42 and the interference power measurement unit 52 with a threshold. It is assumed that the comparison unit 53 stores in advance two reference thresholds Tha and Thb. The reference threshold Tha is a value which can be determined as sufficiently larger than the internal interference Na of the antenna 11*a*. Similarly, the reference threshold Thb is a value which can be determined as sufficiently larger than the internal interference Nb of the antenna 11*b*. The comparison unit 53 is assumed to appropriately store a threshold other than the reference threshold. The comparison unit 53 notifies the selection unit 54 of an obtained result.

The selection unit 54 selects a circuit to be adjusted based on the comparison result notified from the comparison unit 53. When the intensity of the interference power received through the antenna 11*a* is larger than the reference threshold Tha, the selection unit 54 determines that the performance of the antenna 11*a* is not improved although the level of the antenna gain of the antenna 11*a* is changed. Then, when the interference power Ia is larger than the reference threshold Tha, the selection unit 54 does not determine the matching circuit 12*a* connected to the antenna 11*a* as a circuit to be adjusted. Similarly, when the intensity of the interference power (Ib) measured by the interference power measurement unit 42 is larger than the reference threshold Thb, the selection unit 54 determines that the performance of the antenna 11*b* is not improved by changing the level of the antenna gain of the antenna 11*b*. Then, if the interference power Ib is larger than the reference threshold Thb, the selection unit 54 does not determine the matching circuit 12*b* connected to the antenna 11*b* as an circuit to be adjusted. The selection unit 54 notifies the switch unit 27 of the selected circuit.

Figure 11:
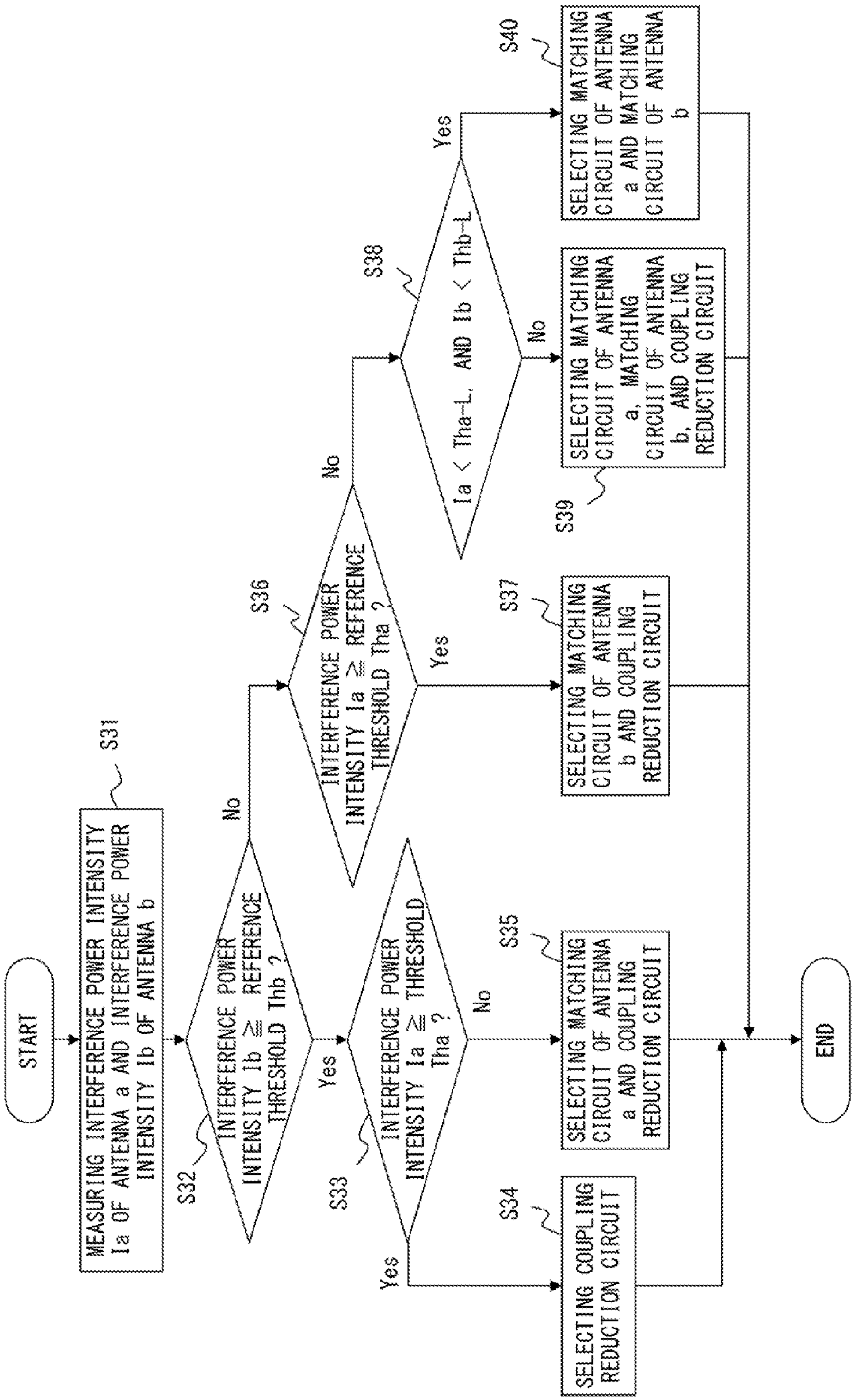
FIG. 11 is a flowchart for explanation of an example of the operation when the communication device according to the third embodiment selects a circuit to be adjusted.

FIG. 11 is a flowchart for explanation of an example of the operation when the communication device 50 according to the third embodiment selects a circuit to be adjusted. In the example in FIG. 11, the comparison unit 53 is assumed to store two thresholds Tha-L and Thb-L in addition to the reference thresholds Tha and Thb. FIG. 11 is an example of an operation, and there is a case in which the operation of the communication device 50 is changed by comparing the interference power Ib with the reference threshold Thb in step S36 after switching the order of steps S32 and S33, for example.

The interference power measurement unit 42 measures the intensity of the interference power Ib from the antenna 11*b*, and the interference power measurement unit 52 measures the intensity of the interference power Ia from the antenna 11*a* (step S31). The interference power measurement unit 42 and the interference power measurement unit 52 notifies the comparison unit 53 of the measured value. The comparison unit 53 compares the interference power Ib notified from the interference power measurement unit 42 with the reference threshold Thb (step S32). When the interference power Ib is equal to or exceeds the reference threshold Thb, the comparison unit 53 compares the interference power Ia notified from the interference power measurement unit 52 with the reference threshold Tha (YES in step S32, step S33). The comparison unit 53 notifies the selection unit 54 of the comparison result obtained in steps S32 and S33. If the interference power Ib from the antenna 11*b* is equal to or exceeds Thb, and the interference power Ia from the antenna 11*a* is equal to or exceeds Tha, then the selection unit 54 selects the coupling reduction circuit 13 as a circuit to be adjusted (step S34). On the other hand, if the interference power Ib from the antenna 11*b* is equal to or exceeds Thb, and the interference power Ia from the antenna 11*a* is smaller than Tha, the selection unit 54 selects the coupling reduction circuit 13 and the matching circuit 12*a* as a circuit to be adjusted (step S35).

If it is determined in step S32 that the interference power Ib is smaller than the reference threshold Thb, the comparison unit 53 compares the interference power Ia notified from the interference power measurement unit 52 with the reference threshold Tha (NO in step S32, step S36). If it is determined in step S36 that the interference power Ia is equal to or exceeds the reference threshold Tha, the comparison unit 53 notifies the selection unit 54 of the comparison result obtained in steps S32 and S36. Then, the selection unit 54 selects the coupling reduction circuit 13 and the matching circuit 12*b* as circuits to be adjusted (YES in step S36, step S37).

On the other hand, if it is determined in step S36 that the interference power Ia is smaller than the reference threshold Tha, the comparison unit 53 compares the interference power Ia with the threshold Tha-L, and compares the interference power Ib with the threshold Thb-L (NO step S36, step S38). The comparison unit 53 notifies the selection unit 54 of the comparison result obtained insteps S32, S36, and S38. In step S38, if one of the conditions that Ia is equal to or exceeds Tha-L and Ib is equal to or exceeds Thb-L is satisfied, then the selection unit 54 selects the matching circuits 12*a* and 12*b* and the coupling reduction circuit 13 as circuits to be adjusted (step S39). On the other hand, if Ia is smaller than Tha-L and Ib is smaller than Thb-L, then the selection unit 54 selects the matching circuits 12*a* and 12*b* as circuits to be adjusted (step S40).

Thus, in the communication device 50, a circuit to be adjusted is selected depending on the intensity of the interference power received by each antenna. Therefore, the comparison unit 53 can compares a threshold with the intensity of interference power without obtaining the difference between the gains of the antennas provided for the communication device 50. Therefore, unlike the case according to the first embodiment in which a threshold is set using the difference between the gains of two antennas, the threshold stored in the comparison unit 53 can be fixed. Therefore, the load on the comparison unit 53 can be reduced when the level is compared between a threshold and interference power.

Fourth Embodiment

According to the fourth embodiment, the communication device 10 capable of changing the amount of change of the capacitance of a capacitor and the amount of change of an inductance value depending on the frequency used in communications is described below. In the following description, ΔC is described as an amount of change of the capacitance of a capacitor, and ΔL is described as an amount of change of the inductance value of an inductor.

The circuit control unit 21 calculates the amount of change of the capacitance of a capacitor and an inductance value depending on the minimum value of the amount of change of the impedance or the reactance. The minimum value of the amount of change of the impedance or the reactance is stored in advance in the memory 1 or stored in the circuit control unit 21. For example, it can be assumed that the minimum value of the amount of change of impedance and reactance is an amount of change of the impedance characteristic of an antenna caused by a difference in how a user holds the communication device 10. In addition, when a folding communication device 10 is used, the difference between the impedance characteristic of an antenna when the communication device 10 is folded and the impedance characteristic when the communication device 10 is set up can be the minimum value of the amount of change of reactance etc. The circuit control unit 21 can acquire the frequency used in communications from, for example, the baseband signal processing unit 41.

Described first is a method of obtaining an amount of change in capacitance of a capacitor. The reactance $X_C$ obtained from the capacitor is expressed by the following equation.

$$X_c = \frac{1}{j2\pi fC} \quad (10)$$

Then, if the amount of change ΔX of the reactance is fluctuated by the capacitor, the amount of change ΔC of the capacitance of the capacitor can be expressed by the equation (11) below.

$$\Delta C = \frac{-j}{2\pi f\Delta X} \quad (11)$$

where j indicates an imaginary number unit, and f indicates a frequency. Therefore, for example, when the minimum value ΔX of the amount of change of the reactance is 80Ω and the frequency is 2 Ghz, then ΔC is 0.99 (pF).

Described next is a method of obtaining an amount of change of an inductance value. The reactance $X_L$ obtained from the inductor is expressed by the following equation.

$$X_L = j2\pi fL \quad (12)$$

If the minimum value ΔX of an amount of change of the reactance is fluctuated by an inductor, the amount of variance ΔL of the inductance value is expressed by the equation (13) below.

$$\Delta L = \frac{-j\Delta X}{2\pi f} \quad (13)$$

Therefore, for example, when the minimum value ΔX of the amount of change of the reactance is 80Ω and the frequency is 1 GHz, ΔL is 12.7 (nH).

The circuit control unit 21 obtains an evaluation function by changing the capacitance of a capacitor and an inductance value by the value of the integral multiple of the acquired amount of variance. The method of selecting a circuit to be adjusted, the method of adjusting a selected circuit, and the method of obtaining an evaluation function are similar to those according to the first and second embodiments.

To reduce the load on the circuit control unit 21, the communication device 10 can also store in the memory 1 the data in which the amount of variance is associated with the frequency used in communications. In this case, the circuit control unit 21 accesses the memory 1 and acquires the amount of variance of the capacitance of a capacitor and the amount of variance of an inductor when a selected circuit is adjusted.

Figures 12A, 12B:
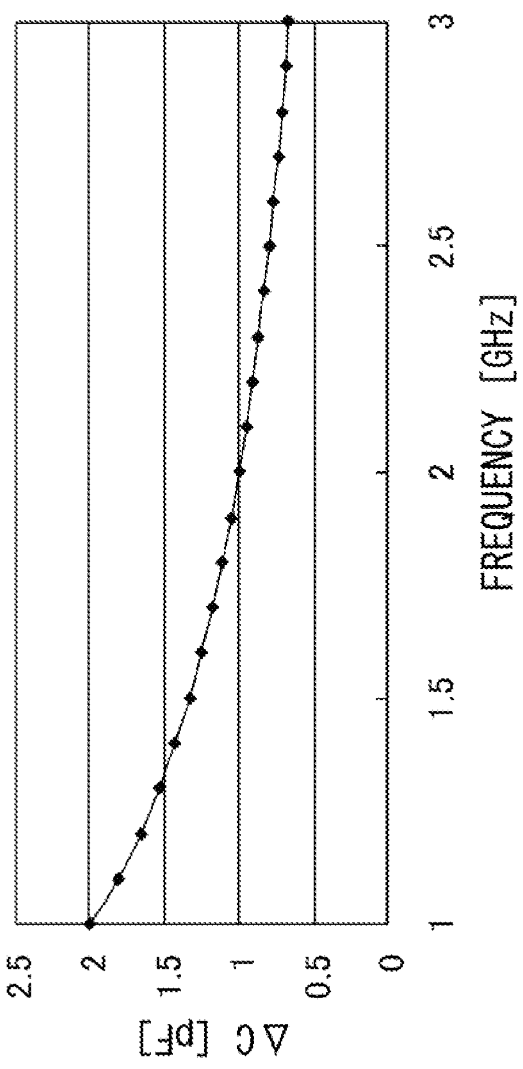
FIGS. 12A and 12B are examples of the relationship between the amount of variance of the capacitance of a capacitor and the frequency.

FIGS. 12A and 12B are examples of the relationship between the amount of variance of the capacitance of a capacitor and the frequency. FIG. 12A illustrates the value of ΔC when the minimum amount of the reactance changed by a capacitor is 79.5Ω plotted as associated with the frequency. It is assumed that the memory 1 holds a capacitance table storing the value of ΔC as associated with the frequency as illustrated in FIG. 12B. As illustrated in FIGS. 12A and 12B, the higher the frequency used in communications is, the smaller the value of ΔC becomes.

Figures 13A, 13B:
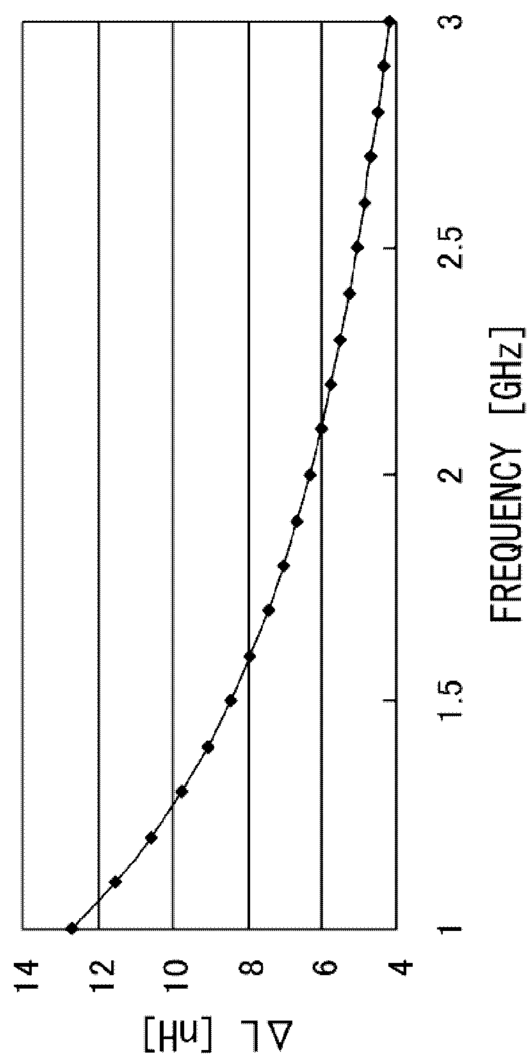
FIGS. 13A and 13B are examples of the relationship between the amount of variance of the inductance value and the frequency.

The communication device 10 can store data in which the ΔL is associated with frequency also for an inductance value. FIGS. 13A and 13B are examples of the relationship between the amount of variance of an inductance value and the frequency. FIG. 13A is a graph in which the value of ΔL when the minimum amount of the reactance changed by the inductor is 79.5Ω is associated with the frequency. In the memory 1, it is assumed that an inductance value table in which the frequency and the value of ΔL are associated with each other and stored as illustrated in FIG. 13B is held. As illustrated in FIGS. 13A and 13B, the higher the frequency used in communications is, the smaller the value of ΔL becomes.

In the description above, the case in which the communication device 10 changes the amount of variance is described. Similarly, the communication device 50 also can change the amount of variance depending on the frequency used in communications. In this case, the method of selecting a circuit to be adjusted, the method adjusting a selected circuit, the method of obtaining an evaluation function, etc. are similar to whose according to the third embodiment. By changing the amount of variance depending on the frequency, the communication devices 10 and 50 can more efficiently improve the performance of an antenna.

Others

The embodiments of the present invention are not limited to the applications above, but can vary in many ways. Some examples are described below.

The communication device 10 can also adjust the matching circuit 12 and the coupling reduction circuit 13 when the reception power of an antenna is smaller than a predetermined value and when the coupled power between the antennas 11*a* and 11*b* reaches or exceeds a predetermined value. In this case, the circuit control unit 21 starts the adjustment depending on the measurement results in the reception power measurement units 24*a* and 24*b*, and the coupled power measurement unit 23.

An evaluation function can be changed depending on the implementation. For example, the evaluation function can be proportional to a product of the reception power of the antenna 11*a* and the reception power of the antenna 11*b*. Furthermore, the larger the coupled power of the antennas 11*a* and 11*b* is, the smaller value the evaluation function can be assigned.

Figure 14:
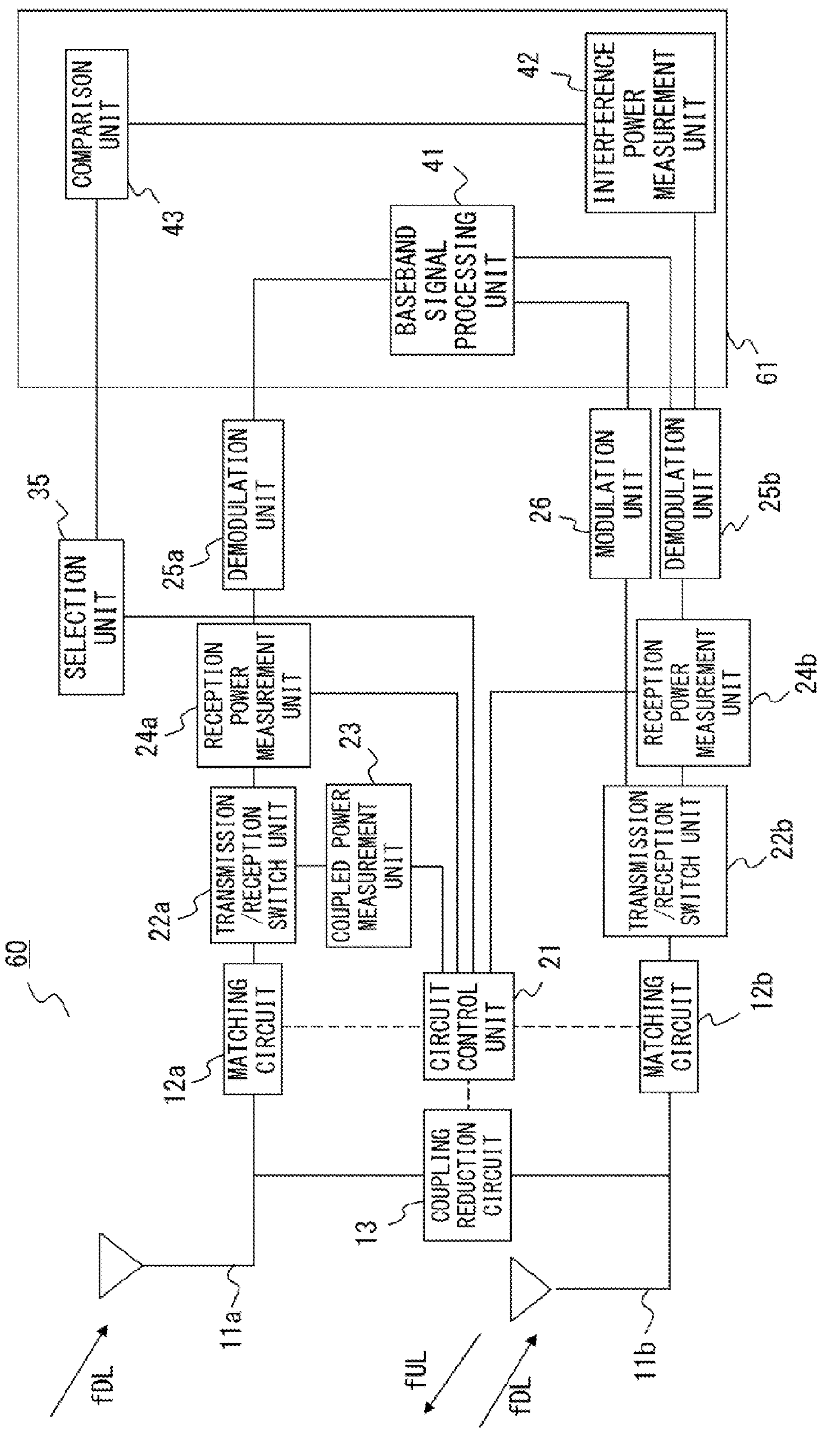
FIG. 14 is an explanatory view of an example of the configuration of the communication device.

FIG. 14 is an explanatory view of an example of the configuration of a communication device 60. The communication device 60 is provided with a selection unit 35 in the RF circuit. The selection unit 35 selects a circuit to be adjusted. The communication device 60 is provided with a baseband signal processing circuit 61. The comparison unit 43 provided for the communication device 60 compares the interference power value measured by the interference power measurement unit 42 with a reference threshold and a threshold, and notifies the selection unit 35 of the obtained result. The method of comparing the reference threshold and the threshold with the interference power value is similar to the method according to the first embodiment. The selection unit 35 selects a circuit to be adjusted based on the comparison result notified from the comparison unit 43. The method of selecting the circuit is similar to the method according to the first embodiment. Thus, a circuit to be adjusted can be selected in the RF circuit 20, or in the baseband signal processing circuit 61 as described in the first through fourth embodiments.

The operations of the antennas 11*a* and 11*b*, the matching circuits 12*a* and 12*b*, the coupling reduction circuit 13, the circuit control unit 21, the transmission/reception switch units 22*a* and 22*b*, the coupled power measurement unit 23, the reception power measurement unit 24, the demodulation units 25*a* and 25*b*, and the modulation unit 26 provided for the communication device 60 are similar to those according to the first and second embodiments. The operations of the baseband signal processing unit 41 and the interference power measurement unit 42 are also similar to those according to the first and second embodiments.

Figure 15:
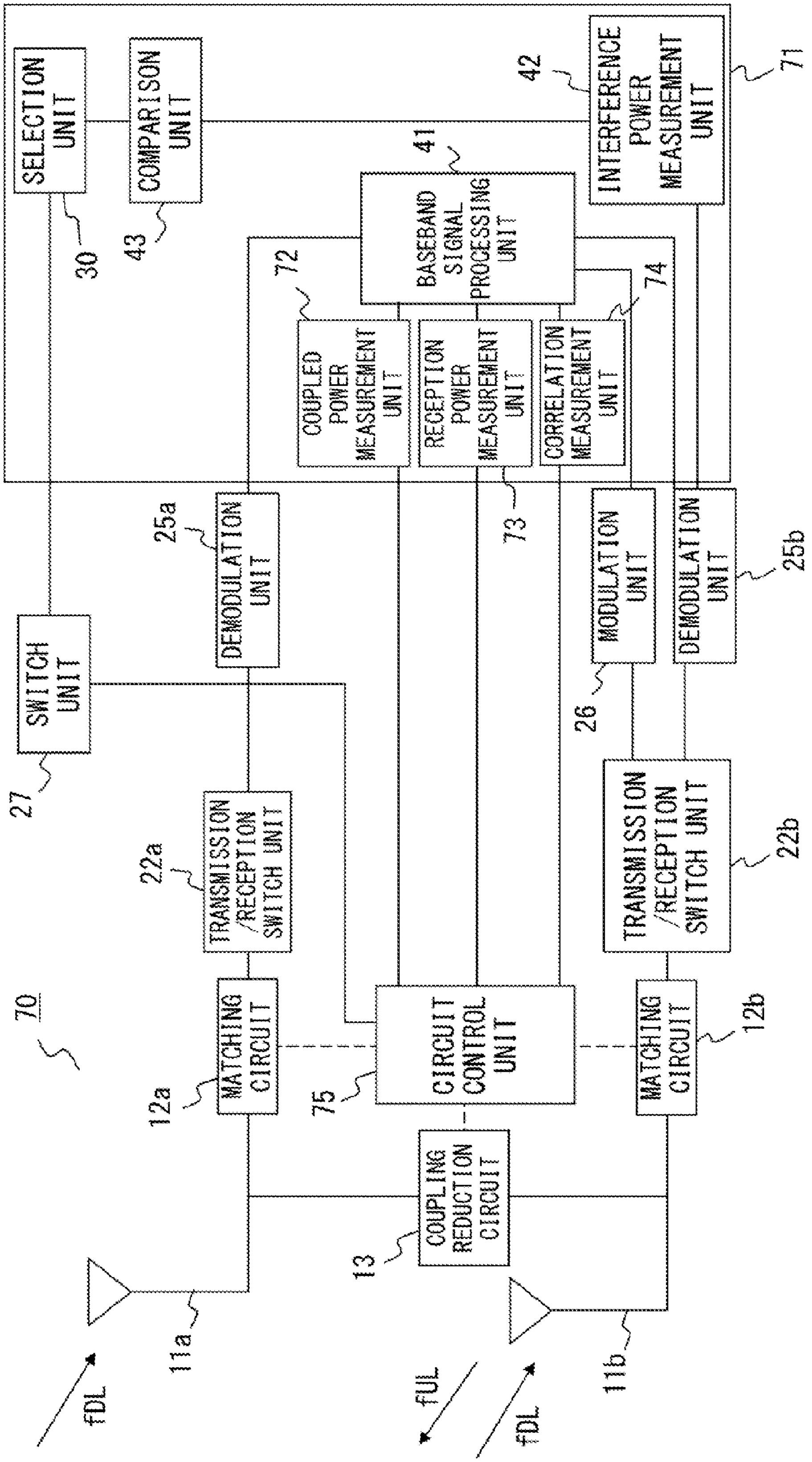
FIG. 15 is an explanatory view of an example of the configuration of the communication device.

FIG. 15 is an explanatory view of the configuration of a communication device 70. The communication device 70 obtains an evaluation function by the equation (7). Then, the correlation measurement unit 74 measures the correlation between the signal received through the antenna 11*a* and the signal received through the antenna 11*b*. The communication device 70 is also provided with a coupled power measurement unit 72 and a reception power measurement unit 73 in a baseband signal processing circuit 71. The coupled power measurement unit 72 monitors the operations of the transmission/reception switch units 22*a* and 22*b*, and obtains the intensity of the power received from the antenna 11*a* while the communication device 70 is transmitting a signal to a base station. The reception power measurement unit 73 obtains the intensity of the power of the received signals from both of the antennas 11*a* and 11*b*. The circuit control unit 75 obtains an evaluation function by the equation (7) using the results obtained from the coupled power measurement unit 72, the reception power measurement unit 73, and the correlation measurement unit 74. The method of the circuit control unit 75 determining an amount of adjustment using the value of the evaluation function is similar to the method according to the first embodiment. In addition, the operations of the antennas 11*a* and 11*b*, the matching circuits 12*a* and 12*b*, the coupling reduction circuit 13, the transmission/reception switch units 22*a* and 22*b*, the demodulation units 25*a* and 25*b*, the modulation unit 26, and the switch unit 27 provided for the communication device 70 are similar to those according to the first embodiment. Furthermore, the operations of the baseband signal processing unit 41, the interference power measurement unit 42, the comparison unit 43, and the selection unit 30 provided for the communication device 70 are also similar to those according to the first embodiment.

The communication device 50 according to the third embodiment can determine the upper limit of the number of conditions used in calculating the evaluation function as described above with reference to the second embodiment. FIG. 16 is an example of the condition number table 31 used in the communication device 50. In the example illustrated in FIG. 16, the control signal used when the matching circuits 12*a* and 12*b* are selected as circuits to be adjusted is "1", and the control signal used when the matching circuits 12*a* and 12*b* and the coupling reduction circuit 13 are selected is "2". The signal used when the matching circuit 12*b* and the coupling reduction circuit 13 are selected is "3", the signal used when the matching circuit 12*a* and the coupling reduction circuit 13 are selected is "4", and the control signal used when the coupling reduction circuit 13 is selected as a circuit to be adjusted is "5". The control signals and the number of conditions illustrated in FIG. 16 are only examples, and can be arbitrarily changed depending on the implementation.

Furthermore, the circuit control unit 21 can perform the adjustment on the selected circuit with the number of conditions smaller than the number stored in the condition number table 31 when the remaining battery level of the terminal is low etc. In this case, when the remaining battery level is lower than a predetermined threshold, the circuit control unit 21 receives a notification from the baseband signal processing unit 41. Upon receipt of the notification from the baseband signal processing unit 41, the circuit control unit 21 can use, for example, the value obtained by subtracting 1 from the number of conditions of 2 or larger stored in the condition number table 31 as the number of conditions for a change of a circuit.

In the description above, the matching circuit 12 and the coupling reduction circuit 13 are adjusted by a variable capacitor and a variable inductor, but the matching circuit 12 and the coupling reduction circuit 13 can also be adjusted using micro electro mechanical systems (MEMS). In this case, the number of conditions stored in the condition number table 31 can be the number of MEMS which can be switched by the matching circuit 12 and the coupling reduction circuit 13.

As described above, according to the embodiments including the first through fourth embodiments, the performance of an antenna can be efficiently improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A communication device, comprising:

a first antenna;

a second antenna;

a first adjustment circuit configured to adjust an impedance of the first antenna;

a second adjustment circuit configured to adjust an impedance of the second antenna;

a coupling reduction circuit configured to reduce an amount of coupling of the first antenna and the second antenna;

a first reception power measurement unit configured to measure first reception power received from the first antenna;

a second reception power measurement unit configured to measure second reception power received from the second antenna;

a selection unit configured to select a circuit to be controlled by an impedance from among the first adjustment circuit, the second adjustment circuit, and the coupling reduction circuit; and a circuit control unit configured to control an impedance of the selected circuit so that a value of an evaluation function proportional to a product of the first reception power and the second reception power becomes larger;

an interference power measurement unit configured to measure interference power received by the first antenna, wherein when the interference power is smaller than a threshold indicating intensity of interference power which does not improve a ratio of power of signal received by the first antenna to the interference power by increasing a gain of the first antenna, the selection unit selects the first adjustment circuit, and when the interference power is equal to or exceeds the threshold, the unit does not select the first adjustment circuit, but selects the coupling reduction circuit.

2. The device according to claim 1, further comprising an adjustment table configured to store a number of times of changing the impedance of each of the first adjustment circuit, the second adjustment circuit, and the coupling reduction circuit as associated with a control signal identifying a combination of circuits selected by the selection unit, wherein:

the circuit control unit changes the impedance and calculates the evaluation function for a circuit included in the combination identified by the control signal received from the selection unit for the number of times associated with the control signal; and the circuit control unit adjusts the impedance of the selected circuit when the evaluation function indicates the largest value.

3. The device according to claim 1, further comprising a coupled power measurement unit configured to measure intensity of coupled power of the first antenna and the second antenna, wherein the evaluation function is set so that the larger the value of the coupled power is, the smaller the evaluation function becomes.

4. A communication device, comprising:

a first antenna;

a second antenna;

a first adjustment circuit configured to adjust an impedance of the first antenna;

a second adjustment circuit configured to adjust an impedance of the second antenna;

a coupling reduction circuit configured to reduce an amount of coupling of the first antenna and the second antenna;

a first reception power measurement unit configured to measure first reception power received from the first antenna;

a second reception power measurement unit configured to measure second reception power received from the second antenna;

a selection unit configured to select a circuit from among the first adjustment circuit, the second adjustment circuit, and the coupling reduction circuit; and a circuit control unit configured to control an impedance of the selected circuit so that a value of an evaluation function proportional to a product of the first reception power and the second reception power becomes larger;

a first interference power measurement unit configured to measure first interference power received by the first antenna; and a second interference power measurement unit configured to measure second interference power received by the second antenna, wherein:

the selection unit compares a first threshold indicating intensity of interference power which does not improve a ratio of power of a signal received by the first antenna to the first interference power by increasing a gain of the first antenna with the first interference power, and compares a second threshold indicating intensity of interference power which does not improve a ratio of power of a signal received by the second antenna to the second interference power by increasing a gain of the second antenna with the second interference power;

the selection unit selects the first adjustment circuit when the first interference power is smaller than the first threshold, and selects the second adjustment circuit when the second interference power is smaller than the second threshold.

5. The device according to claim 1, further comprising a capacitance table in which an amount of variance of capacitance of a capacitor is associated with a frequency band of a received signal, wherein the circuit control unit acquires an amount of variance of capacitance associated with a frequency of a signal received by the first and second antennas, changes capacitance of a capacitor included in the selected circuit by the acquired amount of variance, and obtains the evaluation function.

6. The device according to claim 1, further comprising an inductance value table in which an amount of variance of an inductance value of an inductor is associated with a frequency band of a received signal, wherein the circuit control unit acquires an amount of variance of an inductance value associated with a frequency of a signal received by the first and second antennas, changes an inductance value of an inductor included in the selected circuit by the acquired amount of variance, and obtains the evaluation function.

7. A control method for a communication device which is provided with a first antenna and a second antennaperforms the process comprising:

measuring first reception power received from the first antenna;

measuring second reception power received from the second antenna;

selecting a circuit from among a first adjustment circuit for adjusting an impedance of the first antenna, a second adjustment circuit for adjusting an impedance of the second antenna, and a coupling reduction circuit for reducing an amount of coupling of the first antenna and the second antenna; and controlling an impedance of the selected circuit so that a value of an evaluation function proportional to a product of the first reception power and the second reception power becomes larger.

* * * * *